(12) United States Patent
Mimura et al.

(10) Patent No.: US 11,025,221 B2
(45) Date of Patent: Jun. 1, 2021

(54) ACOUSTIC WAVE DEVICE, HIGH-FREQUENCY FRONT END CIRCUIT, AND COMMUNICATION DEVICE

(71) Applicant: Murata Manufacturing Co., Ltd., Nagaokakyo (JP)

(72) Inventors: Masakazu Mimura, Nagaokakyo (JP); Kazuhiro Takigawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/511,013

(22) Filed: Jul. 15, 2019

(65) Prior Publication Data

US 2019/0341905 A1   Nov. 7, 2019

Related U.S. Application Data

(63) Continuation of application No. PCT/JP2018/001021, filed on Jan. 16, 2018.

(30) Foreign Application Priority Data

Jan. 17, 2017 (JP) .............................. JP2017-006106

(51) Int. Cl.
*H03H 9/145* (2006.01)
*H01L 41/047* (2006.01)
(Continued)

(52) U.S. Cl.
CPC ....... *H03H 9/1457* (2013.01); *H01L 41/0477* (2013.01); *H01L 41/1873* (2013.01);
(Continued)

(58) Field of Classification Search
CPC ............. H03H 9/1457; H03H 9/02559; H03H 9/02992; H03H 9/02818; H03H 9/25;
(Continued)

(56) References Cited

U.S. PATENT DOCUMENTS 7,576,471 B1 * 8/2009 Solal .................. H03H 9/02858
                                                                310/313 B
2004/0164644 A1   8/2004 Nishiyama et al.
(Continued)

FOREIGN PATENT DOCUMENTS

JP        2006-254507 A     9/2006
JP        2013-518455 A     5/2013
(Continued)

OTHER PUBLICATIONS

Official Communication issued in International Patent Application No. PCT/JP2018/001021, dated Apr. 10, 2018.

*Primary Examiner* — Samuel S Outten
(74) *Attorney, Agent, or Firm* — Keating & Bennett, LLP

(57) ABSTRACT

An acoustic wave device includes a piezoelectric substrate and an IDT electrode provided on the piezoelectric substrate. In the IDT electrode, a central region, first and second low acoustic velocity regions and first and second high acoustic velocity regions are disposed in this order. A duty ratio in the first low acoustic velocity region of first electrode fingers and the second low acoustic velocity region of second electrode fingers is larger than a duty ratio in the central region. When acoustic velocity of a transversal bulk wave propagating in metal that is a main component of a main electrode layer is defined as v (m/s), v≤3299 m/s, and when a wave length defined by an electrode finger pitch of the IDT electrode is defined as λ, and a film thickness of the main electrode layer normalized by the wave length λ is defined as T, then $T \geq 0.00018 e^{0.002V} + 0.014$.

20 Claims, 9 Drawing Sheets

(51) Int. Cl.
*H01L 41/187* (2006.01)
*H03H 9/02* (2006.01)
*H03H 9/25* (2006.01)
*H03H 9/64* (2006.01)
*H03H 9/72* (2006.01)
*H03F 3/20* (2006.01)
*H04B 11/00* (2006.01)

(52) U.S. Cl.
CPC ........... *H03F 3/20* (2013.01); *H03H 9/02559* (2013.01); *H03H 9/02818* (2013.01); *H03H 9/02992* (2013.01); *H03H 9/25* (2013.01); *H03H 9/6489* (2013.01); *H03H 9/725* (2013.01); *H04B 11/00* (2013.01); *H03F 2200/171* (2013.01); *H03F 2200/451* (2013.01)

(58) Field of Classification Search
CPC .. H03H 9/6489; H03H 9/725; H01L 41/0477; H01L 41/1873; H03F 3/20; H04B 11/00
See application file for complete search history.

(56) References Cited

U.S. PATENT DOCUMENTS

| | | | |
|---|---|---|---|
| 2009/0267707 A1* | 10/2009 | Miura | H03H 9/1457 333/193 |
| 2011/0068655 A1* | 3/2011 | Solal | H03H 9/02858 310/313 B |
| 2013/0051588 A1 | 2/2013 | Ruile et al. | |
| 2013/0300519 A1 | 11/2013 | Tamasaki et al. | |
| 2016/0211829 A1 | 7/2016 | Iwaki et al. | |
| 2017/0047905 A1 | 2/2017 | Araki et al. | |
| 2017/0279433 A1* | 9/2017 | Matsukura | H03H 3/04 |
| 2018/0123565 A1 | 5/2018 | Takamine | |

FOREIGN PATENT DOCUMENTS

| | | |
|---|---|---|
| JP | 2016-136712 A | 7/2016 |
| KR | 10-2013-0103607 A | 9/2013 |
| KR | 10-2016-145742 A | 12/2016 |
| WO | 2015/182522 A1 | 12/2015 |
| WO | 2016/208677 A1 | 12/2016 |

\* cited by examiner

ACOUSTIC WAVE DEVICE, HIGH-FREQUENCY FRONT END CIRCUIT, AND COMMUNICATION DEVICE

CROSS REFERENCE TO RELATED APPLICATIONS

This application claims the benefit of priority to Japanese Patent Application No. 2017-006106 filed on Jan. 17, 2017 and is a Continuation Application of PCT Application No. PCT/JP2018/001021 filed on Jan. 16, 2018. The entire contents of each application are hereby incorporated herein by reference.

BACKGROUND OF THE INVENTION

1. Field of the Invention

The present invention relates to an acoustic wave device using a piston mode, a high-frequency front end circuit, and a communication device.

2. Description of the Related Art

In order to suppress a spurious component, an acoustic wave device using a piston mode has been proposed.

For example, Japanese Unexamined Patent Application Publication No. 2013-518455 discloses an example of an acoustic wave device using a piston mode. In the acoustic wave device, a region in which a plurality of first electrode fingers and a plurality of second electrode fingers of an IDT electrode overlap each other when viewed in an acoustic wave propagation direction is an intersecting region. In the acoustic wave device described in Japanese Unexamined Patent Application Publication No. 2013-518455, the intersecting region includes a central region located at a center in a direction in which the first and second electrode fingers extend, and first and second edge regions provided on both sides of the central region in the direction in which the first and second electrode fingers extend.

Additionally, in Japanese Unexamined Patent Application Publication No. 2013-518455, a method of forming a low acoustic velocity region by layering a mass addition film made of a dielectric or metal on the first and second electrode fingers in the first and second edge regions, and a method of forming a low acoustic velocity region by making a duty ratio in the first and second edge regions larger than a duty ratio in the central region are disclosed. A region outside the low acoustic velocity region is a high acoustic velocity region in which acoustic velocity is higher than acoustic velocity in the central region. By disposing the central region, the low acoustic velocity region, and the high acoustic velocity region in this order, energy of an acoustic wave is confined and the spurious components caused by high-order transverse modes are suppressed.

Here, in a case of the method of forming the low acoustic velocity region by layering the mass addition film made of a dielectric or metal on the first and second electrode fingers, there is a problem in that a manufacturing cost becomes high because steps of exposure and film formation are required.

Thus, from a viewpoint of the manufacturing cost, the method of forming the low acoustic velocity region by making the duty ratio in the first and second edge regions larger than the duty ratio in the central region is preferable. However, in the case of this method, there is a problem in that, depending on a material and a film thickness of a main electrode layer in the IDT electrode, it is difficult to increase a difference in acoustic velocity between the low acoustic velocity region and the central region to a desired extent or more, and thus the spurious components cannot be suppressed in some cases.

SUMMARY OF THE INVENTION

Preferred embodiments of the present invention provide acoustic wave devices, high-frequency front end circuits, and communication devices, that are each able to effectively reduce or prevent the spurious components caused by high-order transverse modes, in an acoustic wave device using a piston mode, in which a low acoustic velocity region is provided by making a duty ratio in a first edge region and a second edge region larger than a duty ratio in a central region.

An acoustic wave device according to a preferred embodiment of the present invention includes a piezoelectric body, and an IDT electrode provided on the piezoelectric body and including a main electrode layer, in which the IDT electrode includes a first busbar and a second busbar facing each other, a plurality of first electrode fingers first ends of which are connected with the first busbar, and a plurality of second electrode fingers first ends of which are connected with the second busbar, the plurality of second electrode fingers are interdigitated with the plurality of first electrode fingers, and include an intersecting region that is a portion in which the plurality of first electrode fingers and the plurality of second electrode fingers overlap each other in an acoustic wave propagation direction, and when a direction in which the plurality of first electrode fingers extend or a direction in which the plurality of second electrode fingers extend is defined as a length direction, the intersecting region includes, a central region located at a central portion of the first electrode fingers and the second electrode fingers in the length direction, a first low acoustic wave region which is disposed on an outside of the central region on a side of the first busbar in the length direction and in which an acoustic velocity is lower than an acoustic velocity in the central region, and a second low acoustic velocity region which is disposed on an outside of the central region on a side of the second busbar in the length direction and in which an acoustic velocity is lower than the acoustic velocity in the central region, and a first high acoustic velocity region which is disposed on an outside of the first low acoustic velocity region on a side of the first busbar in the length direction and in which an acoustic velocity is higher than the acoustic velocity in the central region, and a second high acoustic velocity region which is disposed on an outside of the second low acoustic velocity region on a side of the second busbar in the length direction and in which an acoustic velocity is higher than the acoustic velocity in the central region are provided, and a duty ratio in the first low acoustic velocity region and the second low acoustic velocity region is greater than a duty ratio in the central region, and $v \leq 3299$ m/s is satisfied, where $v$ (m/s) represents acoustic velocity of a transversal bulk wave propagating in metal that is a main component of the main electrode layer, and when $\lambda$ represents a wave length defined by an electrode finger pitch of the IDT electrode and T represents a film thickness of the main electrode layer normalized by the wave length $\lambda$, Formula 1 below is satisfied:

$$T \geq 0.00018 e^{0.002v} + 0.014 \qquad \text{Formula 1.}$$

In an acoustic wave device according to a preferred embodiment of the present invention, the IDT electrode includes a plurality of layers including the main electrode layer.

In an acoustic wave device according to a preferred embodiment of the present invention, the main electrode layer contains any one of Au, Pt, Ta, Cu, Ni, and Mo as a main component.

In an acoustic wave device according to a preferred embodiment of the present invention, in the IDT electrode, v≤2895 m/s is satisfied, and Formula 2 below is satisfied:

$$T \geq 0.000029 e^{0.0032v} + 0.02 \qquad \text{Formula 2.}$$

In this case, a duty ratio in the central region of the IDT electrode is able to be further increased under a condition that the spurious components caused by high-order transverse modes are able to be effectively reduced or prevented. Thus, electric resistance of the IDT electrode is able to be reduced, and an insertion loss is able to be reduced.

In an acoustic wave device according to a preferred embodiment of the present invention, in the IDT electrode, v≤2491 m/s is satisfied, and Formula 3 below is satisfied:

$$T \geq 0.000038 e^{0.0035v} + 0.025 \qquad \text{Formula 3.}$$

In this case, the duty ratio in the central region of the IDT electrode is able to be further increased under the condition that the spurious components caused by high-order transverse modes are able to be effectively reduced or prevented. Thus, the electric resistance of the IDT electrode is able to be reduced, and the insertion loss is able to be reduced.

In an acoustic wave device according to a preferred embodiment of the present invention, in the IDT electrode, v≤2289 m/s is satisfied, and Formula 4 below is satisfied:

$$T \geq 0.000020 e^{0.0042v} + 0.03 \qquad \text{Formula 4.}$$

In this case, the duty ratio in the central region of the IDT electrode is able to be further increased under the condition that the spurious components caused by high-order transverse modes are able t0 be effectively reduced or prevented. Thus, the electric resistance of the IDT electrode is able to be reduced, and the insertion loss is able to be reduced.

In an acoustic wave device according to a preferred embodiment of the present invention, in the IDT electrode, v≤2087 m/s is satisfied, and Formula 5 below is satisfied:

$$T \geq 0.000017 e^{0.0048v} + 0.033 \qquad \text{Formula 5.}$$

In this case, the duty ratio in the central region of the IDT electrode is able to be further increased under the condition that the spurious components caused by high-order transverse modes are able to be effectively reduced or prevented. Thus, the electric resistance of the IDT electrode is able to be reduced, and the insertion loss is able to be reduced.

In an acoustic wave device according to a preferred embodiment of the present invention, the piezoelectric body is made of $LiNbO_3$, Euler angles ($\varphi$, $\theta$, $\psi$) of the piezoelectric body are Euler angles (0°±5°, $\theta$, 0°±10°), $\theta$ in the Euler angles ($\varphi$, $\theta$, $\psi$) of the piezoelectric body satisfies $\theta \geq 27°$. The Euler angles ($\varphi$, $\theta$, $\psi$) are (0°±5°, {−0.054/(T×r−0.044)+31.33}°±1.5°, 0°±10°) and T×r≤0.10λ holds, when a ratio of a density $\rho$ of a material of the main electrode layer to a density $\rho_{Pt}$ of Pt is defined as $r=\rho/\rho_{Pt}$. In this case, it is possible to further reduce or prevent the spurious components caused by an SH wave.

In an acoustic wave device according to a preferred embodiment of the present invention, the first busbar and the second busbar of the IDT electrode include cavities, and in the first and second busbars, a portion located closer to the central region in the length direction than the cavity is an inner busbar portion, a portion opposite to the inner busbar portion with the cavity interposed is an outer busbar portion, and in the first busbar, the inner busbar portion is a low acoustic velocity region, a region in which the cavity is provided is the first high acoustic velocity region, and in the second busbar, the inner busbar portion is a low acoustic velocity region, and a region in which the cavity is provided is the second high acoustic velocity region.

An acoustic wave device according to a preferred embodiment of the present invention includes a piezoelectric body, and an IDT electrode provided on the piezoelectric body and including a main electrode layer, in which the IDT electrode includes a first busbar and a second busbar facing each other, a plurality of first electrode fingers first ends of which are connected with the first busbar, and a plurality of second electrode fingers first ends of which are connected with the second busbar, the plurality of second electrode fingers are interdigitated with the plurality of first electrode fingers, and includes an intersecting region in which the plurality of first electrode fingers and the plurality of second electrode fingers overlap each other in an acoustic wave propagation direction, and when a direction in which the plurality of first electrode fingers extend or a direction in which the plurality of second electrode fingers extend is defined as a length direction, the intersecting region includes, a central region located at a central portion of the first electrode fingers and the second electrode fingers in the length direction, a first low acoustic wave region which is disposed on an outside of the central region on a side of the first busbar in the length direction and in which an acoustic velocity is lower than an acoustic velocity in the central region, and a second low acoustic velocity region which is disposed on an outside of the central region on a side of the second busbar in the length direction and in which an acoustic velocity is lower than the acoustic velocity in the central region, and a first high acoustic velocity region which is disposed on an outside of the first low acoustic velocity region on a side of the first busbar in the length direction and in which an acoustic velocity is higher than the acoustic velocity in the central region, and a second high acoustic velocity region which is disposed on an outside of the second low acoustic velocity region on a side of the second busbar in the length direction and in which an acoustic velocity is higher than the acoustic velocity in the central region are provided, and V2/V1≤0.98 is satisfied, where V1 represents acoustic velocity in the central region and V2 represents acoustic velocity in the first low acoustic velocity region and the second low acoustic velocity region.

In an acoustic wave device according to a preferred embodiment of the present invention, a dielectric film is further provided on the piezoelectric body so as to cover the IDT electrode. In this case, a surface of the IDT electrode is able to be protected, and the IDT electrode is less likely to be damaged.

A high-frequency front end circuit according to a preferred embodiment of the present invention includes an acoustic wave device according to a preferred embodiment of the present invention and a power amplifier.

A communication device according to a preferred embodiment of the present invention includes a high-frequency front end circuit according to a preferred embodiment of the present invention and an RF signal processing circuit.

According to preferred embodiments of the present invention, acoustic wave devices using a piston mode are provided in each of which a low acoustic velocity region is provided by making a duty ratio in a first edge region and a second edge region larger than a duty ratio in a central region, high-frequency front end circuits, and communication devices that are able to effectively reduce or prevent the spurious components caused by high-order transverse modes.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the accompanying drawings.

The preferred embodiments described herein are illustrative and a partial substitution or combination of configurations may be possible between different preferred embodiments.

Figure 1:
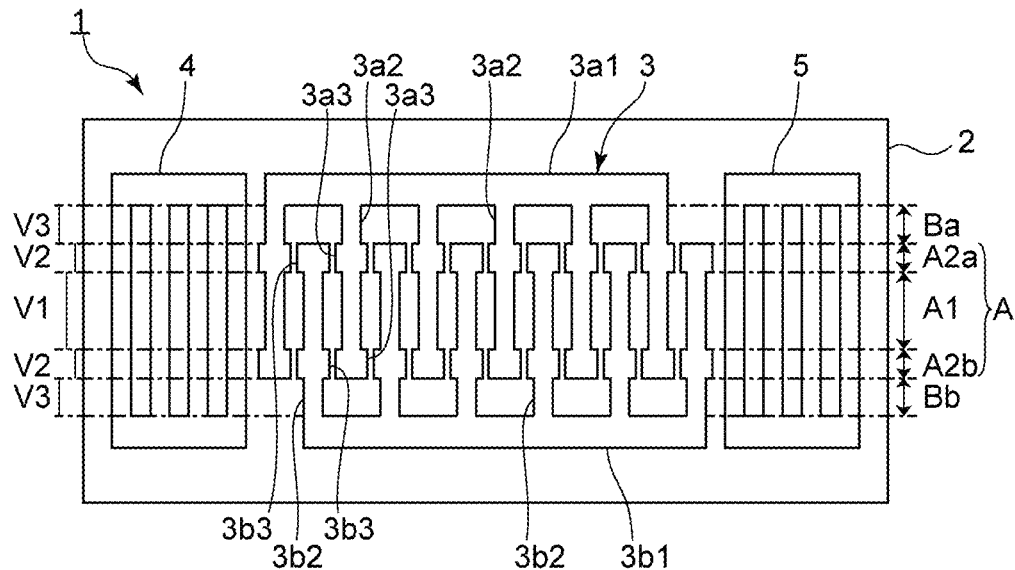
FIG. 1 is a plan view of an acoustic wave device according to a first preferred embodiment of the present invention.

FIG. 1 is a plan view of an acoustic wave device according to a first preferred embodiment of the present invention. In FIG. 1, first and second dielectric films that will be described later are omitted.

An acoustic wave device 1 is preferably, for example, a one-port acoustic wave resonator. The acoustic wave device 1 includes a piezoelectric substrate 2 defining a piezoelectric body. The piezoelectric substrate 2 is preferably made of, for example, $LiNbO_3$.

An IDT electrode 3 is provided on the piezoelectric substrate 2. By applying an AC voltage to the IDT electrode 3, an acoustic wave is excited. A reflector 4 and a reflector 5 are disposed on both sides in an acoustic wave propagation direction of the IDT electrode 3, respectively.

The IDT electrode 3 includes a first busbar 3a1 and a second busbar 3b1 opposed to each other. The IDT electrode 3 includes a plurality of first electrode fingers 3a2 first ends of which are connected with the first busbar 3a1. Further, the IDT electrode 3 includes a plurality of second electrode fingers 3b2 first ends of which are connected with the second busbar 3b1.

The plurality of first electrode fingers 3a2 and the plurality of second electrode fingers 3b2 are interdigitated with each other. The IDT electrode 3 includes an intersecting region A where the first electrode fingers 3a2 and the second electrode fingers 3b2 overlap each other in the acoustic wave propagation direction. Here, a direction in which the first electrode fingers 3a2 and the second electrode fingers 3b2 extend is defined as a length direction of the first electrode fingers 3a2 and the second electrode fingers 3b2. With this, the intersecting region A includes a central region A1 located at a central portion in the length direction, and a first edge region A2a and a second edge region A2b disposed on both sides of the central region A1 in the length direction respectively. The first edge region A2a is located on a side of the first busbar 3a1, and the second edge region A2b is located on a side of the second busbar 3b1.

The IDT electrode 3 includes a first outer region Ba on a side of the first edge region A2a opposite to a side of the central region A1 and a second outer region Bb on a side of the second edge region A2b opposite to a side of the central region A1. The first outer region Ba is located between the first edge region A2a and the first busbar 3a1. The second outer region Bb is located between the second edge region A2b and the second busbar 3b1.

Figure 2:
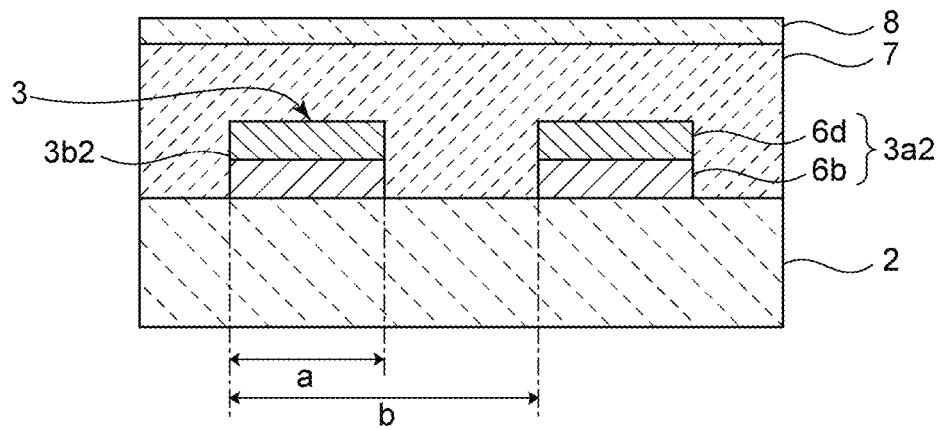
FIG. 2 is an enlarged front sectional view of an IDT electrode in the first preferred embodiment according to the present invention.

FIG. 2 is an enlarged front sectional view of the IDT electrode in the first preferred embodiment. Here, a dimension along the acoustic wave propagation direction in the first electrode finger and the second electrode finger is defined as a width. A dimension "a" in FIG. 2 indicates a width of the first electrode finger or the second electrode finger. A dimension "b" indicates a distance between one end of the first electrode finger along the acoustic wave propagation direction and the one end of the second electrode finger adjacent to the first electrode finger.

The IDT electrode 3 is preferably made of a layered metal film including a plurality of metal layers that are laminated. The IDT electrode 3 includes a main electrode layer 6b. The main electrode layer 6b occupies a largest mass among the plurality of metal layers of the IDT electrode 3. In the present preferred embodiment, the main electrode layer is preferably made of, for example, metal having density higher than that of Al. As such metal, it is preferable to use, for example, one containing any one of Au, Pt, Ta, Cu, Ni, and Mo as a main component. Note that, the material of the main electrode layer 6b is not limited to the above, and any metal having higher density than that of Al is sufficient. Thus, even when a dielectric film is provided on the IDT electrode 3, a reflection coefficient of an acoustic wave is able to be increased.

In the present preferred embodiment, in the IDT electrode 3, a conductive auxiliary electrode layer 6d is provided on the main electrode layer 6b provided on the piezoelectric substrate 2. The conductive auxiliary electrode layer 6d is preferably made of metal having lower electric resistance than that of the main electrode layer 6b. More specifically, the conductive auxiliary electrode layer 6d is preferably made of, for example, Al. Since the conductive auxiliary electrode layer 6d is included, electric resistance of the IDT electrode 3 is able to be reduced. Note that, layered structure of the IDT electrodes 3 is not limited to the above. Further, the IDT electrode 3 may be made of a single-layer metal film including only the main electrode layer 6b.

A first dielectric film 7 defining and functioning as a dielectric film of the present invention is provided on the piezoelectric substrate 2 so as to cover the IDT electrode 3. In the present preferred embodiment, the first dielectric film 7 is preferably made of, for example, silicon oxide such as $SiO_2$. As a result, frequency temperature characteristics are able to be improved. In addition, a surface of the IDT electrode 3 is able to be protected, and the IDT electrode 3 is less likely to be damaged. Note that, a material of the first dielectric film 7 is not limited to the above. The first dielectric film 7 need not be provided.

A second dielectric film 8 is provided on the first dielectric film 7. In the present preferred embodiment, the second dielectric film 8 is preferably made of, for example, silicon nitride such as SiN. By adjusting a film thickness of the second dielectric film 8, it is possible to easily adjust a frequency. Note that, a material of the second dielectric film 8 is not limited to the above. The second dielectric film 8 need not be provided.

Referring back to FIG. 1, each of the plurality of first electrode fingers 3a2 includes wide portions 3a3 having a width larger than that of other portions in the first edge region A2a and the second edge region A2b, respectively. Similarly, each of the plurality of second electrode fingers 3b2 includes wide portions 3b3.

Since the plurality of first electrode fingers 3a2 include the wide portions 3a3, and the plurality of second electrode fingers 3b2 include the wide portions 3b3, an acoustic velocity of acoustic waves in the first edge region A2a and the second edge region A2b is lower than a propagation velocity (hereinafter, referred to as acoustic velocity) in a propagation direction of an acoustic wave in the central region A1. Here, an acoustic velocity of the acoustic wave in the central region A1 is defined as V1, and an acoustic velocity of the acoustic wave in the first edge region A2a and the second edge region A2b is defined as V2. With this, V1>V2 is satisfied. In this manner, the first edge region A2a is defined as a first low acoustic velocity region, and the second edge region A2b is defined as a second low acoustic velocity region.

A portion located in the first outer region Ba includes only the first electrode fingers 3a2. A portion located in the second outer region Bb includes only the second electrode fingers 3b2. Thus, the acoustic velocity of acoustic waves in the first outer region Ba and the second outer region Bb is higher than the acoustic velocity of the acoustic wave in the central region A1. Here, the acoustic velocity of the acoustic waves in the first outer region Ba and the second outer region Bb is defined as V3. With this, V3>V1 is satisfied. As described above, the first outer region Ba and the second outer region Bb are a first high acoustic velocity region and a second high acoustic velocity region, respectively, in which acoustic velocity is higher than that in the central region A1.

The first and second low acoustic velocity regions are disposed outside the central region A1, and the first and second high acoustic velocity regions are disposed outside the first and second low acoustic velocity regions, respectively. Here, a dimension of the first and second low acoustic velocity regions along a direction orthogonal or substantially orthogonal to the acoustic wave propagation direction is defined as a width of the first and second low acoustic velocity regions. By adjusting the acoustic velocity V1 in the central region A1, the acoustic velocity V2 in the first and second low acoustic velocity regions, the acoustic velocity V3 in the first and second high acoustic velocity regions, and the width of the first and second low acoustic velocity regions, it is possible to make an acoustic wave displacement distribution in a direction in which the first electrode fingers extend and in a direction in which the second electrode fingers extend in the central region A1 constant or substantially constant. As a result, a piston mode is generated, thus the spurious components caused by high-order transverse modes are able to be reduced or prevented. As described above, the acoustic wave device 1 utilizes the piston mode.

The above-described relationship among the acoustic velocities V1, V2 and V3 is illustrated in FIG. 1. It is illustrated that in FIG. 1, the acoustic velocity on the outer side is higher.

Here, the inventors of preferred embodiments of the present invention have discovered that, in the acoustic wave device 1 using the piston mode, when the acoustic velocity ratio V2/V1 becomes about 0.98 or less, the spurious components are able to be effectively reduced or prevented.

Additionally, the inventors of preferred embodiments of the present invention have also discovered that in the acoustic wave device 1 using the piston mode (hereinafter, referred to as "plane piston mode") in which the first low acoustic velocity region and the second low acoustic velocity region are provided by making a duty ratio in the first edge region A2a and a duty ratio in the second edge region A2b larger than a duty ratio in the central region A1, conditions 1) and 2) under which the acoustic velocity ratio V2/V1 becomes about 0.98 or less are described below.

Note that, the duty ratio is a percentage of a portion where the electrode is provided in the acoustic wave propagation direction, and is expressed by a/b by using the dimension "a" and the dimension "b" in FIG. 2. Further, it is known to those skilled in the art that when the duty ratio is excessively small, the IDT electrode cannot be provided, and when the duty ratio is excessively large, a gap between the electrode fingers of the IDT electrode cannot be provided and a short circuit occurs, thus it is difficult to provide the IDT electrode when the duty ratio is not within a range of about 0.30 or more and about 0.80 or less.

1) v≤3299 m/s, where v (m/s) is acoustic velocity of a transversal bulk wave propagating in metal that is a main component of the main electrode layer 6b.

2) The following Formula 1 is satisfied when λ is a wave length defined by an electrode finger pitch of the IDT electrode and T is a film thickness of the main electrode layer 6b normalized by the wave length λ:

$$T \geq 0.00018 e^{0.002v} + 0.014 \quad \text{Formula 1.}$$

That is, the inventors of preferred embodiments of the present invention have discovered that, in the acoustic wave device 1 using the plane piston mode, by selecting a material and a film thickness of the main electrode layer 6b in the IDT electrode 3 that satisfy the conditions 1) and 2), an acoustic velocity difference between the first low acoustic velocity region and the second low acoustic velocity region, and the central region is able to be increased to a certain extent or more, and the spurious components are able to be reduced or prevented.

As described above, in the acoustic wave device 1 using the piston mode, when the acoustic velocity ratio V2/V1 becomes about 0.98 or less, the spurious components are able to be effectively reduced or prevented. This is illustrated in FIG. 3.

Figure 3:
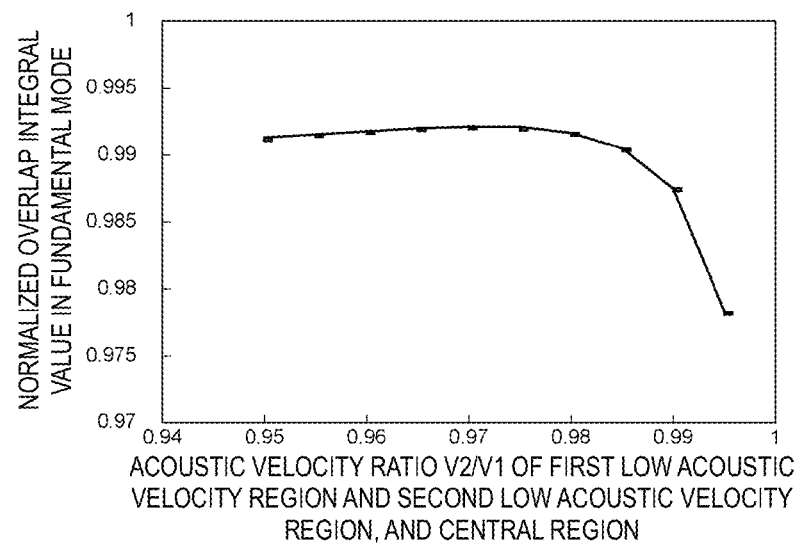
FIG. 3 is a diagram illustrating a relationship between a normalized overlap integral value in a fundamental mode and an acoustic velocity ratio V2/V1.

FIG. 3 is a diagram illustrating a relationship between a normalized overlap integral value in a fundamental mode and the acoustic velocity ratio V2/V1. A vertical axis in FIG. 3 indicates the normalized overlap integral value in the fundamental mode described in Japanese Unexamined Patent Application Publication No. 2013-518455. This integral value is used as an index indicating a degree to which the spurious components caused by high-order transverse modes are able to be reduced or prevented, and indicates that as a value of the normalized overlap integral value in the fundamental mode is closer to 1, the spurious components caused by high-order transverse modes are reduced or prevented. A horizontal axis indicates the acoustic velocity ratio V2/V1 of the first low acoustic velocity region and the second low acoustic velocity region, and the central region.

In order to determine the relationship illustrated in FIG. 3, the following conditions were used. Note that, a dimension along a direction orthogonal or substantially orthogonal to an acoustic wave propagation direction in the intersecting region is defined as an intersecting width. The direction orthogonal or substantially orthogonal to the acoustic wave propagation direction is defined as an intersecting width direction.

Intersecting width: about 10λ

An acoustic velocity ratio V3/V1 between the first high acoustic velocity region and the second high acoustic velocity region, and the central region: about 1.08

An anisotropy coefficient (1+Γ in the following formula): about 0.7485

The width of the first low acoustic velocity region and second low acoustic velocity region: set according to the following Formula 6.

Note that, the following Formula 6 is represented by an Expression 5 in Japanese Unexamined Patent Application Publication No. 2013-518455 (corresponding International Publication No. is WO2011/088904).

Expression 1

$$W = \frac{v_{ZAB}}{2\pi f} \left| \sqrt{1+\Gamma} \right| \frac{\arctan\sqrt{\frac{\Delta v_{AB}}{\Delta v_{RB}}}}{\sqrt{2 \frac{\Delta v_{RB}}{v_{ZAB}}}} \quad \text{Formula 6}$$

Note that, Japanese Unexamined Patent Application Publication No. 2013-518455 describes that, when a width of a first low acoustic velocity region and a second low acoustic velocity region is set according to the Formula 6, displacement distribution of acoustic waves in a central region is able to be made constant or substantially constant, and a piston mode is generated.

Under this condition, a change in the displacement distribution in the intersecting width direction in the fundamental mode was determined when the acoustic velocity ratio V2/V1 of the first low acoustic velocity region and the second low acoustic velocity region, and the central region was changed. The relationship in FIG. 3 shows normalized overlap integral values determined by using the above.

As illustrated in FIG. 3, under the conditions in which the acoustic velocity ratio V2/V1 is about 0.98 or less, the overlap integral values are constant or approximately constant at a value of about 0.992 that is a value close to 1. However, when the acoustic velocity ratio V2/V1 becomes larger than about 0.98, the overlap integral value decreases rapidly. Thus, under the conditions in which the acoustic velocity ratio V2/V1 is about 0.98 or less, it is possible to effectively reduce or prevent the spurious components caused by high-order transverse modes.

Note that, in addition to the plane piston mode, also in an acoustic wave device using another common piston mode, when the acoustic velocity ratio V2/V1 becomes about 0.98 or less, the spurious components are able to be effectively reduced or prevented.

Next, it is illustrated below that one of conditions under which the acoustic velocity ratio V2/V1 becomes about 0.98 or less in the acoustic wave device using the plane piston mode may be manufactured is the following 1).

1) v≤3299 m/s, where v (m/s) is the acoustic velocity of the transversal bulk wave propagating in the metal that is the main component of the main electrode layer 6b.

Here, in order to reduce or minimize the acoustic velocity ratio V2/V1 as far as possible during the manufacturing, it is necessary to set the minimum value of acoustic velocity as far as possible in the manufacturing to V2, and to set the maximum value of acoustic velocity as far as possible during the manufacturing to V1.

When Pt is used for the main electrode layer and the film thickness of the main electrode layer is set to about 0.02λ, about 0.04λ, and about 0.06λ, changes in acoustic velocity of an acoustic wave with respect to changes in duty ratio was determined. Conditions are as follows.

Piezoelectric substrate: material LiNbO₃, Euler angles (0°, 30°, 0°)

Main electrode layer: material Pt, film thickness about 0.02λ, about 0.04λ, about 0.06λ

Conductive auxiliary electrode layer: material Al, film thickness about 0.08λ

First dielectric film: material SiO₂, film thickness about 0.30λ

Second dielectric film: material SiN, film thickness about 0.01λ

Acoustic wave used: Rayleigh wave

Figure 4:
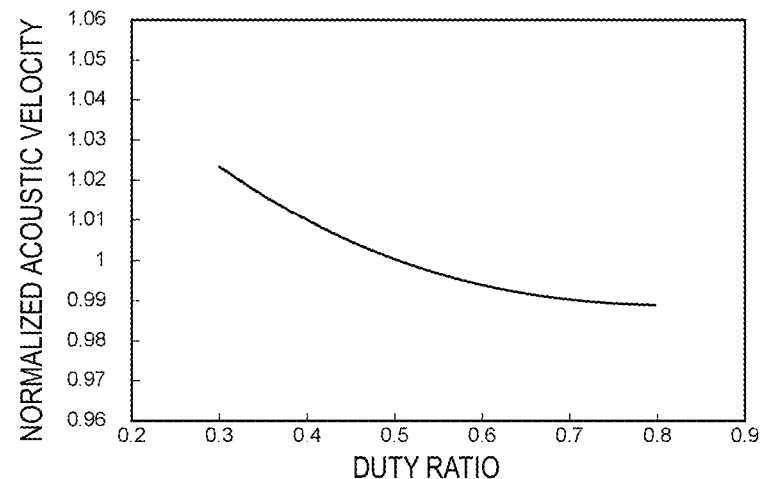
FIG. 4 is a diagram illustrating a relationship between a duty ratio and a normalized acoustic velocity when a thickness of a main electrode layer made of Pt is set to about $0.02\lambda$.
Figure 5:
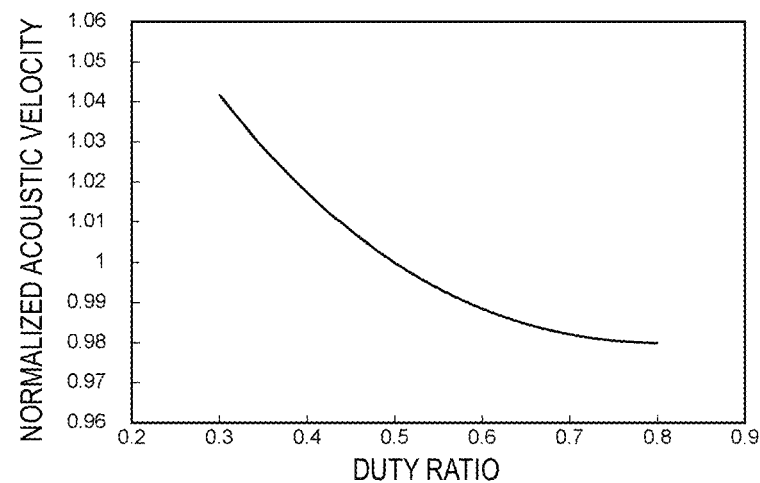
FIG. 5 is a diagram illustrating a relationship between the duty ratio and the normalized acoustic velocity when the thickness of the main electrode layer made of Pt is set to about $0.04\lambda$.
Figure 6:
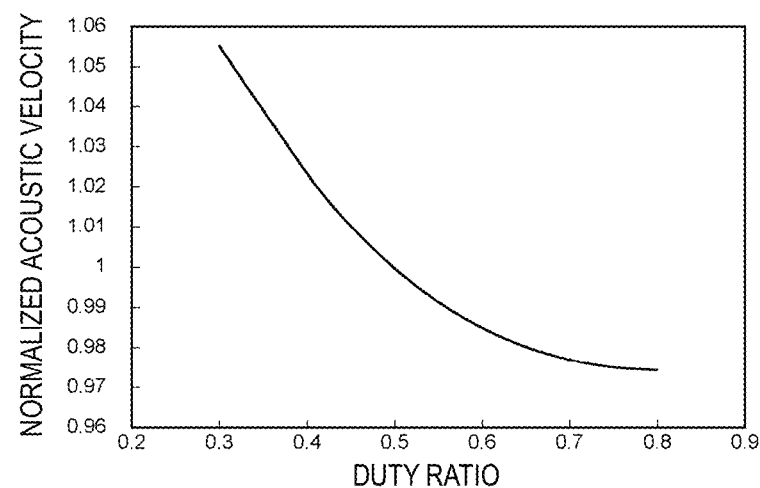
FIG. 6 is a diagram illustrating a relationship between the duty ratio and the normalized acoustic velocity when the thickness of the main electrode layer made of Pt is set to about $0.06\lambda$.

FIG. 4 is a diagram illustrating a relationship between the duty ratio and the normalized acoustic velocity when the thickness of the main electrode layer made of Pt is set to about 0.02λ. FIG. 5 is a diagram illustrating a relationship between the duty ratio and the normalized acoustic velocity when the thickness of the main electrode layer made of Pt is set to about 0.04λ. FIG. 6 is a diagram illustrating a relationship between the duty ratio and the normalized acoustic velocity when the thickness of the main electrode layer made of Pt is set to about 0.06λ. Note that, in each of FIG. 4 to FIG. 6, a vertical axis represents the normalized acoustic velocity normalized, with acoustic wave velocity when the duty ratio is about 0.5 being 1.

As illustrated in FIG. 4 to FIG. 6, when Pt is used for the main electrode layer, the acoustic velocity of the acoustic wave becomes higher as the duty ratio becomes smaller, and the acoustic velocity of the acoustic wave becomes lower as the duty ratio becomes larger. Thus, by making a width in the first edge region larger than a width in the central region of the first electrode fingers and the second electrode fingers, it is possible to configure the first low acoustic velocity region. Similarly, by making a width in the second edge region larger than the width in the central region of the first electrode fingers and the second electrode fingers, it is possible to configure the second low acoustic velocity region.

Further, since the acoustic velocity increases as the duty ratio is reduced, the acoustic velocity V1 in the central region is able to be increased as the duty ratio in the central region is reduced, and the acoustic velocity ratio V2/V1 is able to be reduced. Thus, the spurious components caused by high-order transverse modes are able to be effectively reduced or prevented.

Note that, when the duty ratio is made excessively small, the width of the first electrode finger and the second electrode finger becomes excessively narrow, so that it becomes difficult to provide the IDT electrode stably, and a problem arises in that manufacturing becomes difficult. Thus, it is preferable to set the minimum value of the duty ratio to about 0.30 or more, for example.

As illustrated in FIG. 4 to FIG. 6, the change in the normalized acoustic velocity with respect to the change in the duty ratio is in a downward convex state. That is, inclination of a curve indicating the change in the normalized acoustic velocity becomes gentler as the duty ratio increases. The normalized acoustic velocity is reduced or minimized in a vicinity of the duty ratio of about 0.80. Thus, it is preferable that the duty ratio in the first low acoustic velocity region and the second low acoustic velocity region is set to a value at which the acoustic velocity is minimized. However, when the duty ratio is excessively increased, an insulation withstand voltage between the first electrode fingers and the second electrode fingers adjacent to each other deteriorates, making manufacturing difficult, and thus, it is preferable to set the duty ratio to about 0.80 or less, for example. When Pt is used for the main electrode layer, the duty ratio in the first low acoustic velocity region and the second low acoustic velocity region is preferably about 0.80, for example.

When the film thickness of the main electrode layer made of Pt is about 0.02λ and the duty ratio is about 0.80, the normalized acoustic velocity becomes about 0.989 and is reduced or minimized. That is, when this condition is selected for the duty ratio in the first low acoustic velocity region and the second low acoustic velocity region, the normalized acoustic velocity V2 in the first low acoustic velocity region and the second low acoustic velocity region becomes about 0.989. Note that, the normalized acoustic velocity in the first low acoustic velocity region and the second low acoustic velocity region is denoted by V2, similar to the acoustic velocity. The normalized acoustic velocity in the central region is also denoted by V1, similar to the acoustic velocity.

On the other hand, when the duty ratio in the central region is set to about 0.41, the normalized acoustic velocity V1 in the central region becomes about 1.009. At this time, the acoustic velocity ratio of the first low acoustic velocity region and the second low acoustic velocity region to the central region satisfies V2/V1=0.989/1.009=about 0.98. Thus, when the film thickness of the main electrode layer made of Pt is about 0.02λ, by setting the duty ratio in the central region to about 0.41 or less, the acoustic velocity ratio V2/V1 of the first low acoustic velocity region and the second low acoustic velocity region, and the central region is able to be set to about 0.98 or less.

Similarly, when the film thickness of the main electrode layer is about 0.04λ, and the duty ratio is about 0.80, the normalized acoustic velocity is minimized at about 0.980. That is, when this condition is selected for the duty ratio in the first low acoustic velocity region and the second low acoustic velocity region, the normalized acoustic velocity V2 in the first low acoustic velocity region and the second low acoustic velocity region becomes about 0.980. On the other hand, when the duty ratio in the central region is set to about 0.50, the normalized acoustic velocity V1 in the central region becomes about 1.000. At this time, the acoustic velocity ratio of the first low acoustic velocity region and the second low acoustic velocity region to the central region satisfies V2/V1=0.980/1.000=about 0.98. Thus, when the film thickness of the main electrode layer made of Pt is about 0.04λ, by setting the duty ratio in the central region to about 0.50 or less, the acoustic velocity ratio V2/V1 of the first low acoustic velocity region and the second low acoustic velocity region, and the central region is able to be set to about 0.98 or less.

Similarly, when the film thickness of the main electrode layer is about 0.06λ and the duty ratio is about 0.80, the normalized acoustic velocity is minimized at about 0.974. That is, when this condition is selected for the duty ratio in the first low acoustic velocity region and the second low acoustic velocity region, the normalized acoustic velocity V2 in the first low acoustic velocity region and the second low acoustic velocity region becomes about 0.974. On the other hand, when the duty ratio in the central region is set to about 0.53, the normalized acoustic velocity V1 in the central region becomes about 0.994. At this time, the acoustic velocity ratio of the first low acoustic velocity region and the second low acoustic velocity region to the central region satisfies V2/V1=0.974/0.994=about 0.98. Thus, when the film thickness of the main electrode layer made of Pt is about 0.06λ, by setting the duty ratio in the central region to about 0.53 or less, the acoustic velocity ratio V2/V1 of the first low acoustic velocity region and the second low acoustic velocity region, and the central region can be set to about 0.98 or less.

When the film thickness of the main electrode layer made of Pt was other than the above, the duty ratio in the central region at which the acoustic velocity ratio V2/V1 became about 0.98 was determined, when the duty ratio in the first low acoustic velocity region and the second low acoustic velocity region was set to a duty ratio at which the acoustic velocity V2 was the lowest as far as possible during the manufacturing. This is illustrated in FIG. 7 below.

Figure 7:
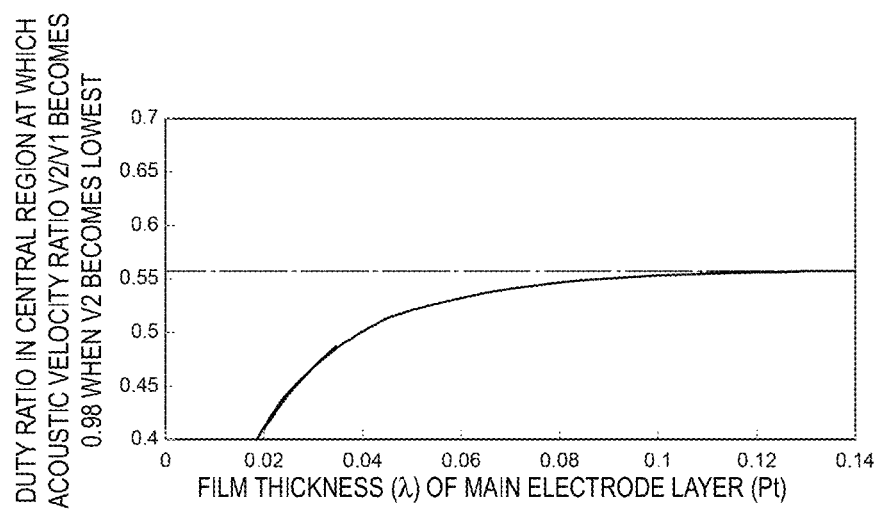
FIG. 7 is a diagram illustrating a relationship between a duty ratio in a central region at which the acoustic velocity ratio V2/V1 becomes about 0.98 when the acoustic velocity V2 in a first low acoustic velocity region and a second low acoustic velocity region becomes the lowest, and the film thickness of the main electrode layer made of Pt.

FIG. 7 is a diagram illustrating a relationship between the duty ratio in the central region at which the acoustic velocity ratio V2/V1 becomes about 0.98 when the acoustic velocity V2 in the first low acoustic velocity region and the second low acoustic velocity region becomes the lowest, and the film thickness of the main electrode layer made of Pt.

As illustrated in FIG. 7, in order to increase the duty ratio in the central region in a state where the acoustic velocity ratio V2/V1 is about 0.98, it is necessary to increase the film thickness of the main electrode layer. However, even when the film thickness of the main electrode layer is set to about 0.12λ or more, a duty ratio at which the acoustic velocity ratio V2/V1 is able to be set to about 0.98 does not exceed about 0.557. That is, in order to achieve the plane piston mode by using Pt for the main electrode layer, it is necessary to set the duty ratio in the central region to about 0.557 or less, and further to set the film thickness of the main electrode layer according to that duty ratio. More specifically, it is necessary to set the film thickness of the main electrode layer to a film thickness such that a value of the duty ratio in the central region is equal to or larger than a value indicated by the curve in FIG. 7.

In the conventional knowledge, it has been considered that by increasing a film thickness of a main electrode layer, the dependency of acoustic velocity on a duty ratio is increased, and an acoustic velocity difference is able to be easily increased. However, surprisingly, the inventors of preferred embodiments of the present invention have discovered from the above results that the dependency of the acoustic velocity on the duty ratio does not increase even when the film thickness of the main electrode layer is increased to a certain extent or more. That is, the inventors of preferred embodiments of the present invention have discovered that there is an upper limit to the duty ratio in the central region at which the spurious components are able to be reduced or prevented by the plane piston mode.

Similar consideration was given to a case where metal other than Pt was used for the main electrode layer, and a maximum duty ratio in the central region at which the acoustic velocity ratio V2/V1 is able to be set to about 0.98 was determined. This was done for a plurality of types of metal.

Then, a relationship between the maximum duty ratio in the central region determined in the above at which the acoustic velocity ratio V2/V1 is able to be set to about 0.98, and the acoustic velocity v of the transversal bulk wave propagating in the main electrode layer was determined.

Figure 8:
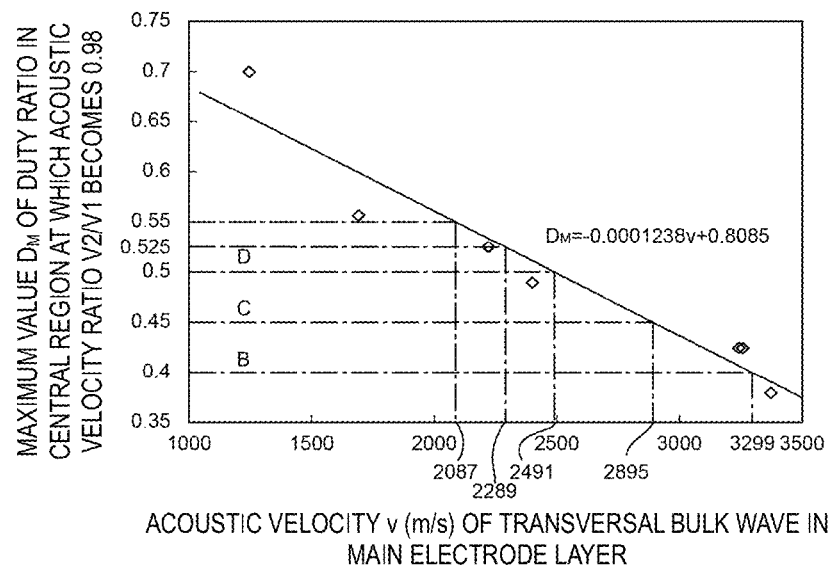
FIG. 8 is a diagram illustrating a relationship between a maximum value of the duty ratio in the central region at which the acoustic velocity ratio V2/V1 becomes about 0.98 and an acoustic velocity v of a transversal bulk wave propagating in metal that is a main component of the main electrode layer.

The results are illustrated in FIG. 8. Note that, FIG. 8 is a diagram illustrating the relationship between the maximum value of the duty ratio in the central region at which the acoustic velocity ratio V2/V1 becomes about 0.98 and the acoustic velocity v of the transversal bulk wave propagating in metal that is a main component of the main electrode layer.

The acoustic velocity of the transversal bulk wave propagating in the metal is an inherent value in each of various metals. Here, the acoustic velocity of the transversal bulk wave propagating in the metal that is the main component of the main electrode layer is defined as v (m/s). The acoustic velocity v of the transversal bulk wave propagating in the metal is expressed by $v=(c_{44}/\rho)^{0.5}$. Note that, $\rho$ (kg/m$^3$) is the density of the metal, and $c_{44}$ (Pa) is one of elements of an elastic stiffness constant of the metal. Since the metal handled here may be regarded as an isotropic body, an elastic stiffness constant $c_{ij}$ is expressed by the following determinant.

Expression 2

$$c_{ij} = \begin{bmatrix} c_{12} + 2c_{44} & c_{12} & c_{12} & 0 & 0 & 0 \\ c_{12} & c_{12} + 2c_{44} & c_{12} & 0 & 0 & 0 \\ c_{12} & c_{12} & c_{12} + 2c_{44} & 0 & 0 & 0 \\ 0 & 0 & 0 & c_{44} & 0 & 0 \\ 0 & 0 & 0 & 0 & c_{44} & 0 \\ 0 & 0 & 0 & 0 & 0 & c_{44} \end{bmatrix}$$

Here, the density $\rho$ (kg/m$^3$), the elastic constant $C_{44}$, and the acoustic velocity v of the transversal bulk wave propagating in the metal, of the metal suitably used for the main electrode layer in preferred embodiments of the present invention such as Au, Pt, Ta, Cu, Ni, and Mo, for example, are shown in Table 1.

TABLE 1

|  | Density $\rho$ (kg/m$^3$) | $c_{44}$ [GPa] | Transversal bulk wave acoustic velocity v [m/s] |
| --- | --- | --- | --- |
| Au | 19300 | 29.9 | 1244.7 |
| Pt | 21370 | 61 | 1689.5 |
| Ta | 16600 | 81.82 | 2220.1 |
| Cu | 8930 | 51.4 | 2399.1 |

TABLE 1-continued

| | Density ρ (kg/m$^3$) | $c_{44}$ [GPa] | Transversal bulk wave acoustic velocity v [m/s] |
|---|---|---|---|
| Ni | 8850 | 92.9 | 3239.9 |
| Mo | 10280 | 109 | 3256.2 |

As illustrated in FIG. 8, it can be seen that, as the acoustic velocity v of the transversal bulk wave propagating in the metal that is the main component of the main electrode layer decreases, the maximum value of the duty ratio in the central region at which the acoustic velocity ratio V2/V1 is able to be set to about 0.98 or less increases. That is, when metal for which the acoustic velocity of the transversal bulk wave is a certain value or less is not used as the main electrode layer, no matter how the duty ratio in the first low acoustic velocity region and the second low acoustic velocity region is set, the value of the acoustic velocity ratio V2/V1 cannot be set to about 0.98 or less except for a case where the duty ratio in the central region is set to a small value equal to or smaller than the above maximum value.

A value of the upper limit of the duty ratio in the central region depends on the material of the main electrode layer. Then, the inventors of preferred embodiments of the present invention have discovered from this result that the above upper limit value of the duty ratio in the central region is highly correlated with the acoustic velocity v of the transversal bulk wave propagating in the metal, among physical property values of the material of the main electrode layer. Thus, in order to achieve reduction or prevention of the spurious components that is the advantageous effect of the present invention, metals used for the main electrode layer are limited. That is, it is necessary to use a metal for which the transversal wave acoustic velocity is low as the main electrode layer.

Here, when the maximum value of the duty ratio in the central region at which the acoustic velocity ratio V2/V1 becomes about 0.98 is defined as $D_M$ in FIG. 8, a relational expression between $D_M$ and the acoustic velocity v (m/s) of the transversal bulk wave propagating in the metal that is the main component of the main electrode layer 6b of the IDT electrode may be expressed by the following formula.

$$D_M = -0.0001238v + 0.8085$$

For example, in order to set the acoustic velocity ratio V2/V1 to about 0.98 or less while setting the duty ratio in the central region of the IDT electrode to about 0.40, it is necessary to use a metal satisfying v≤3299 m/s for the main electrode layer of the IDT electrode, according to the above formula. Note that, when the duty ratio in the central region is less than about 0.40, the acoustic velocity V1 in the central region becomes higher than that in the case of the duty ratio about 0.40, so that the acoustic velocity ratio V2/V1 is able to be set to about 0.98 or less similarly, by using the metal satisfying the above conditions for the main electrode layer.

Next, it is described below that one of the conditions under which the acoustic velocity ratio V2/V1 becomes about 0.98 or less is 2) below.

2) The following Formula 1 is satisfied when λ is a wave length defined by an electrode finger pitch of an IDT electrode, and T is a film thickness of a main electrode layer normalized by the wave length λ.

$$T \geq 0.00018 e^{0.002v} + 0.014 \quad \text{Formula 1}$$

Here, since the duty ratio in the central region is set to about 0.40, in order to make the acoustic velocity ratio V2/V1 the minimum value, it is necessary to set V1 to a value when the duty ratio is about 0.40, and to make V2 the minimum value as far as possible during the manufacturing. Since V2<V1 is required, it is necessary to make the duty ratio in the first low acoustic velocity region and the second low acoustic velocity region larger than the duty ratio in the central region, and to make V2 the minimum value within a range of the duty ratio of about 0.40 or more and about 0.80 or less, for example.

Note that, the value when the duty ratio is about 0.40, and the minimum value in the range of the duty ratio of about 0.4 or more and about 0.80 or less depend on the value of the film thickness of the main electrode layer made of the metal satisfying the above-described condition 1). Thus, in the following, conditions under which the acoustic velocity ratio V2/V1 becomes about 0.98 or less for the material used for the main electrode layer and the film thickness of the main electrode layer will be discussed in detail.

The duty ratio in the central region is set to about 0.40, and the duty ratio in the first low acoustic velocity region and the second low acoustic velocity region is set to a duty ratio at which the acoustic velocity becomes the lowest within the range of about 0.40 or more and about 0.80 or less. In this case, when the main electrode layer is made of Pt, as illustrated in FIG. 7, the film thickness of the main electrode layer at which the acoustic velocity ratio of the first low acoustic velocity region and the second low acoustic velocity region to the central region becomes about 0.98 is about 0.019λ.

Similarly, a relationship similar to that illustrated in FIG. 7 was determined also for a case where the metal satisfying the above 1), such as Au, Cu, Mo, Ta, or Ni, for example, was used for the main electrode layer. When the duty ratio in the central region was set to about 0.40, and the duty ratio in the first low acoustic velocity region and the second low acoustic velocity region was set to the duty ratio at which the acoustic velocity becomes the lowest within the range of about 0.40 or more and about 0.80 or less, the film thickness T of the main electrode layer was determined at which the acoustic velocity ratio V2/V1 of the first low acoustic velocity region and the second low acoustic velocity region, and the central region becomes about 0.98. A relationship between this film thickness T and the acoustic velocity v of the transversal bulk wave propagating in the metal that is the main component of the main electrode layer was determined.

Figure 9:
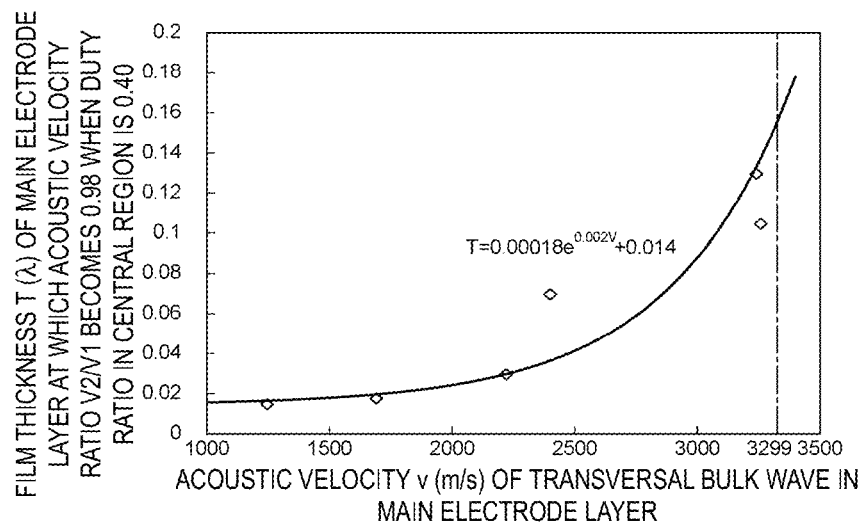
FIG. 9 is a diagram illustrating a relationship between the acoustic velocity v of the transversal bulk wave propagating in the metal that is the main component of the main electrode layer and a film thickness T of the main electrode layer at which the duty ratio in the central region is about 0.40 and the acoustic velocity ratio V2/V1 becomes about 0.98.

FIG. 9 is a diagram illustrating a relationship between the acoustic velocity v of the transversal bulk wave propagating in the metal that is the main component of the main electrode layer, and the film thickness T of the main electrode layer at which the duty ratio in the central region is about 0.40 and the acoustic velocity ratio V2/V1 becomes about 0.98.

Plots indicated in FIG. 9 are approximately located on a curve that is represented by the following formula.

$$T = 0.00018 e^{0.002v} + 0.014$$

By making the film thickness of the main electrode layer larger than the film thickness T represented by this formula, the acoustic velocity ratio V2/V1 of the first low acoustic velocity region and the second low acoustic velocity region, and the central region is able to be set to about 0.98 or less. Note that, when the duty ratio in the central region is smaller than about 0.40, the acoustic velocity V1 in the central region becomes higher than that in the case of the duty ratio of about 0.40, so that by making the film thickness of the main electrode layer larger than the film thickness T expressed by the above formula, similarly the acoustic velocity ratio V2/V1 is able to be set to about 0.98 or less.

Thus, by using the metal satisfying the above 1) for the main electrode layer to satisfy a condition of the following Formula 1, the acoustic velocity ratio V2/V1 is able to be set to about 0.98 or less.

$$T \geq 0.00018 e^{0.002v} + 0.014 \qquad \text{Formula 1}$$

The conditions 1) and 2) are conditions under which the spurious components are able to be effectively reduced or prevented when the duty ratio in the central region is about 0.4. When the duty ratio in the central region is smaller than about 0.4, the acoustic velocity V1 in the central region becomes higher than that in the case of the duty ratio of about 0.4, so that by using the metal satisfying the above conditions 1) and 2) for the main electrode layer, the acoustic velocity ratio V2/V1 is able to be set to about 0.98 or less, and the spurious components are able to be effectively reduced or prevented. That is, by using the metal satisfying the conditions 1) and 2) for the main electrode layer, as the duty ratio in the central region, a range of about 0.3 or more and about 0.4 or less, for example, is able to be selected.

In addition, when the film thickness of the main electrode layer is excessively large, it is difficult to form the IDT electrode, and when a dielectric film is provided on the IDT electrode, there is a problem that a crack is likely to occur in the dielectric layer. Thus, it is preferable that the film thickness T of the main electrode layer satisfy $T \leq 0.20\lambda$, for example.

As described above, as the duty ratio in the central region is reduced, the acoustic velocity V1 in the central region is able to be increased, and the acoustic velocity ratio V2/V1 is able to be reduced. Thus, the spurious components caused by high-order transverse modes are able to be effectively reduced or prevented. However, when the duty ratio is set to be excessively small, electric resistance of the first electrode fingers and the second electrode fingers becomes excessively large, so that a problem arises in that an insertion loss of the acoustic wave device becomes large. Thus, it is preferable to make the duty ratio in the central region as large as possible. This makes it possible to reduce the insertion loss of the acoustic wave device. From the above, there is a trade-off relationship between the reduction or prevention of the spurious components and the reduction of the insertion loss. In the present preferred embodiment, it is possible to improve the trade-off therebetween and to make them compatible with each other.

For example, when the duty ratio in the central region of the IDT electrode is increased to about 0.45, and when the acoustic velocity ratio V2/V1 becomes about 0.98 or less, the spurious components are able to be effectively reduced or prevented, and the electric resistance of the IDT electrode is able to be reduced. The inventors of preferred embodiments of the present invention have discovered that the conditions under which, when the duty ratio in the central region of the IDT electrode is set to about 0.45, and the acoustic velocity ratio V2/V1 becomes about 0.98 or less are 3) and 4) described later.

3) $v \leq 2895$ m/s, where v (m/s) is the acoustic velocity of the transversal bulk wave propagating in the metal that is the main component of the main electrode layer.

4) The following Formula 2 is satisfied when $\lambda$ is the wave length defined by the electrode finger pitch of the IDT electrode, and T is the film thickness of the main electrode layer normalized by the wave length $\lambda$.

$$T \geq 0.000029 e^{0.0032v} + 0.02 \qquad \text{Formula 2}$$

The following will describe that the conditions under which, when the duty ratio in the central region of the IDT electrode is set to about 0.45, and the acoustic velocity ratio V2/V1 becomes about 0.98 or less are 3) and 4) described above.

First, as illustrated in FIG. 8, when the duty ratio in the central region is set to about 0.45, the condition for the acoustic velocity v of the transversal bulk wave of a metal material under which the acoustic velocity ratio is able to be set to about 0.98 or less is $v \leq 2895$ m/s. Note that, when the duty ratio in the central region is smaller than about 0.45, the acoustic velocity V1 in the central region becomes higher than that in the case of the duty ratio of about 0.45, so that the acoustic velocity ratio V2/V1 is able to be set to about 0.98 or less similarly, by using the metal satisfying the above conditions for the main electrode layer.

Then, in the metal satisfying the above condition 3), when the duty ratio is about 0.45, the acoustic velocity becomes the maximum value, and thus, in order to make the acoustic velocity ratio V2/V1 the minimum value, V1 is set to a value when the duty ratio is about 0.45, and V2 is set to the minimum value within a range of the duty ratio of about 0.45 or more and about 0.8 or less, for example.

Note that, the value when the duty ratio is about 0.45, and the minimum value in the range of the duty ratio of about 0.45 or more and about 0.8 or less depend on the value of the film thickness of the main electrode layer made of the metal satisfying the condition 3). Thus, in the following, conditions under which the acoustic velocity ratio V2/V1 becomes about 0.98 or less for the material used for the main electrode layer and the film thickness of the main electrode layer will be discussed in detail.

The duty ratio in the central region is set to about 0.45, and the duty ratio in the low acoustic velocity region is set to a duty ratio at which the acoustic velocity becomes the lowest within a range of about 0.45 or more and about 0.80 or less. In this case, when the main electrode layer is made of Pt, as illustrated in FIG. 7, the film thickness of the main electrode layer at which the acoustic velocity ratio V2/V1 of the first low acoustic velocity region and the second low acoustic velocity region, and the central region becomes about 0.98 is about $0.027\lambda$.

Similarly, a relationship similar to that illustrated in FIG. 7 was determined also for the case where the metal satisfying the above 3), such as Au, Cu, or Ta, was used for the main electrode layer. When the duty ratio in the central region was set to the duty ratio about 0.45, and the duty ratio in the first low acoustic velocity region and the second low acoustic velocity region was set to a duty ratio at which the acoustic velocity becomes the lowest within the range of about 0.45 or more and about 0.80 or less, the film thickness T of the main electrode layer was determined at which the acoustic velocity ratio V2/V1 of the first low acoustic velocity region and the second low acoustic velocity region, and the central region becomes about 0.98. A relationship between this film thickness T and the acoustic velocity v of the transversal bulk wave propagating in the metal that is the main component of the main electrode layer was determined.

Figure 10:
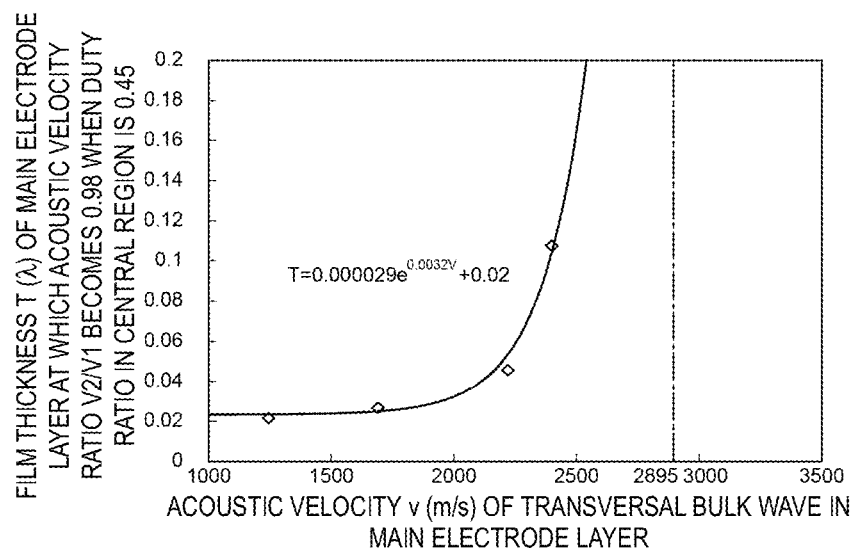
FIG. 10 is a diagram illustrating a relationship between the acoustic velocity v of the transversal bulk wave propagating in the metal that is the main component of the main electrode layer and the film thickness T of the main electrode layer at which the duty ratio in the central region is about 0.45 and the acoustic velocity ratio V2/V1 becomes about 0.98.

FIG. 10 is a diagram illustrating a relationship between the acoustic velocity v of the transversal bulk wave propagating in the metal that is the main component of the main electrode layer and the film thickness T of the main electrode layer at which the duty ratio in the central region is about 0.45 and the acoustic velocity ratio V2/V1 becomes about 0.98.

Plots indicated in FIG. 10 are approximately located on a curve that is represented by the following formula.

$$T = 0.000029 e^{0.0032v} + 0.02$$

By making the film thickness of the main electrode layer larger than the film thickness T represented by this formula, the acoustic velocity ratio V2/V1 of the first low acoustic velocity region and the second low acoustic velocity region, and the central region is able to be set to about 0.98 or less. Note that, when the duty ratio in the central region is smaller than about 0.45, the acoustic velocity V1 in the central region becomes higher than that in the case of the duty ratio about 0.45, so that by making the film thickness of the main electrode layer larger than the film thickness T expressed by the above formula, similarly the acoustic velocity ratio V2/V1 is able to be set to about 0.98 or less.

Thus, by using the metal satisfying the above 3) as the main electrode layer to satisfy a condition of the following Formula 2, the acoustic velocity ratio V2/V1 is able to be set to about 0.98 or less.

$$T \geq 0.000029 e^{0.0032v} + 0.02 \qquad \text{Formula 2}$$

The conditions 3) and 4) are conditions under which the spurious components are able to be effectively reduced or prevented when the duty ratio in the central region is about 0.45. When the duty ratio in the central region is smaller than about 0.45, the acoustic velocity V1 in the central region becomes higher than that in the case of the duty ratio about 0.45, so that by using the metal satisfying the above conditions 3) and 4) for the main electrode layer, the acoustic velocity ratio V2/V1 is able to be set to about 0.98 or less, and the spurious components are able to be effectively reduced or prevented. That is, by using the metal satisfying conditions 3) and 4) for the main electrode layer, as the duty ratio in the central region, a range of about 0.3 or more and about 0.45 or less, for example, is able to be selected. That is, since it becomes possible to select a large duty ratio, it is possible to reduce the resistance of the electrode fingers and to reduce the insertion loss of the acoustic wave device.

When the duty ratio in the central region of the IDT electrode is increased to about 0.50, the electric resistance of the IDT electrode is able to be further reduced or prevented, and the insertion loss is able to be further reduced. The inventors of preferred embodiments of the present invention have discovered that the conditions under which, while the duty ratio in the central region of the IDT electrode is set to about 0.50, and the acoustic velocity ratio V2/V1 becomes about 0.98 or less are 5) and 6) below.

5) $v \leq 2491$ m/s, where v (m/s) is the acoustic velocity of the transversal bulk wave propagating in the metal that is the main component of the main electrode layer.

6) The following Formula 3 is satisfied when λ is the wave length defined by the electrode finger pitch of the IDT electrode, and T is the film thickness of the main electrode layer normalized by the wave length λ.

$$T \geq 0.000038 e^{0.0035v} + 0.025 \qquad \text{Formula 3}$$

First, as illustrated in FIG. 8, when the duty ratio in the central region is set to about 0.50, the condition for the acoustic velocity v of the transversal bulk wave of a metal material under which the acoustic velocity ratio is able to be set to about 0.98 or less is $v \leq 2491$ m/s. Note that, when the duty ratio in the central region is smaller than about 0.50, the acoustic velocity V1 in the central region becomes higher than that in the case of the duty ratio of about 0.50, so that the acoustic velocity ratio V2/V1 is able to be set to about 0.98 or less similarly, by using the metal satisfying the above conditions for the main electrode layer.

Then, in the metal satisfying the above condition 5), when the duty ratio is about 0.50, the acoustic velocity becomes the maximum value, and thus, in order to make the acoustic velocity ratio V2/V1 the minimum value, V1 is set to a value when the duty ratio is about 0.50, and V2 is set to the minimum value within a range of the duty ratio of about 0.5 or more and about 0.8 or less, for example.

Note that, the value when the duty ratio is about 0.50, and the minimum value in the range of the duty ratio of about 0.50 or more and about 0.80 or less depend on the value of the film thickness of the main electrode layer made of the metal satisfying the condition 5). Thus, in the following, conditions under which the acoustic velocity ratio V2/V1 becomes about 0.98 or less for the material used for the main electrode layer and the film thickness of the main electrode layer will be discussed in detail.

The duty ratio in the central region is set to about 0.50, and the duty ratio in the low acoustic velocity region is set to a duty ratio at which the acoustic velocity becomes the lowest within the range of the duty ratio of about 0.50 or more and about 0.80 or less. In this case, when the main electrode layer is made of Pt, as illustrated in FIG. 7, the film thickness of the main electrode layer at which the acoustic velocity ratio V2/V1 of the first low acoustic velocity region and the second low acoustic velocity region, and the central region becomes about 0.98 is about 0.04λ.

Similarly, a relationship similar to that illustrated in FIG. 7 was determined also for the case where the metal satisfying the above 5), such as Au or Ta, for example, was used for the main electrode layer. When the duty ratio in the central region was set to about 0.50, and the duty ratio in the first low acoustic velocity region and the second low acoustic velocity region was set to the duty ratio at which the acoustic velocity becomes the lowest within the range of about 0.50 or more and about 0.80 or less, the film thickness T of the main electrode layer was determined at which the acoustic velocity ratio V2/V1 of the first low acoustic velocity region and the second low acoustic velocity region, and the central region becomes about 0.98. A relationship between this film thickness T and the acoustic velocity v of the transversal bulk wave propagating in the metal that is the main component of the main electrode layer was determined.

Figure 11:
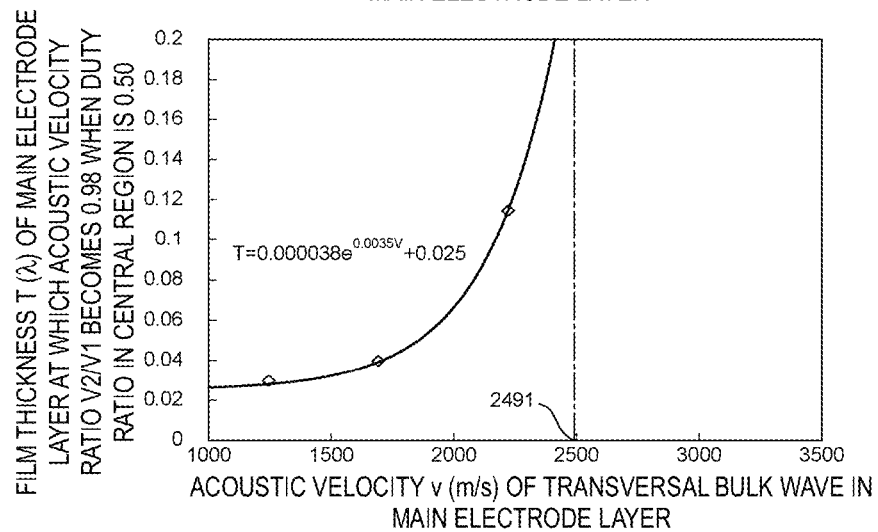
FIG. 11 is a diagram illustrating a relationship between the acoustic velocity v of the transversal bulk wave propagating in the metal that is the main component of the main electrode layer and the film thickness T of the main electrode layer at which the duty ratio in the central region is about 0.50 and the acoustic velocity ratio V2/V1 becomes about 0.98.

FIG. 11 is a diagram illustrating a relationship between the acoustic velocity v of the transversal bulk wave propagating in the metal that is the main component of the main electrode layer, and the film thickness T of the main electrode layer at which the duty ratio in the central region is about 0.50 and the acoustic velocity ratio V2/V1 becomes about 0.98.

Plots indicated in FIG. 11 are approximately located on a curve that is represented by the following formula.

$$T = 0.000038 e^{0.0035v} + 0.025$$

By making the film thickness of the main electrode layer larger than the film thickness T represented by this formula, the acoustic velocity ratio V2/V1 of the first low acoustic velocity region and the second low acoustic velocity region, and the central region is able to be set to about 0.98 or less. Note that, when the duty ratio in the central region is smaller than about 0.50, the acoustic velocity V1 in the central region becomes higher than that in the case of the duty ratio about 0.50, so that by making the film thickness of the main electrode layer larger than the film thickness T expressed by the above formula, similarly the acoustic velocity ratio V2/V1 is able to be set to about 0.98 or less.

Thus, by using the metal satisfying the above 5) as the main electrode layer to satisfy a condition of the following Formula 3, the acoustic velocity ratio V2/V1 is able to be set to about 0.98 or less.

$$T \geq 0.000038 e^{0.0035v} + 0.025 \qquad \text{Formula 3}$$

The conditions 5) and 6) are conditions under which the spurious components are able to be effectively reduced or prevented when the duty ratio in the central region is about 0.5. When the duty ratio in the central region is smaller than about 0.5, the acoustic velocity V1 in the central region becomes higher than that in the case of the duty ratio about 0.5, so that by using the metal satisfying the above conditions 5) and 6) for the main electrode layer, the acoustic velocity ratio V2/V1 is able to be set to about 0.98 or less, and the spurious components are able to be effectively reduced or prevented. That is, by using the metal satisfying conditions 5) and 6) for the main electrode layer, as the duty ratio in the central region, a range of about 0.3 or more and about 0.5 or less, for example, is able to be selected. That is, since it becomes possible to select a further larger duty ratio, it is possible to further reduce the resistance of the electrode fingers and to further reduce the insertion loss of the acoustic wave device.

Here, it is possible to reduce the electric resistance of the IDT electrode as the duty ratio in the central region of the IDT electrode is increased, and to reduce the insertion loss. For example, when the duty ratio in the central region of the IDT electrode is increased to about 0.525, and when the acoustic velocity ratio V2/V1 becomes about 0.98 or less, the spurious components are able be effectively reduced or prevented, and the electric resistance of the IDT electrode is able to be further reduced. The inventors of preferred embodiments of the present invention have discovered that the conditions under which, when the duty ratio in the central region of the IDT electrode is set to about 0.525, and the acoustic velocity ratio V2/V1 becomes about 0.98 or less are 7) and 8) described later.

7) $v \leq 2289$ m/s, where v (m/s) is the acoustic velocity of the transversal bulk wave propagating in the metal that is the main component of the main electrode layer.

8) The following Formula 4 is satisfied when λ is the wave length defined by the electrode finger pitch of the IDT electrode, and T is the film thickness of the main electrode layer normalized by the wave length λ.

$$T \geq 0.000020 e^{0.0042v} + 0.030 \qquad \text{Formula 4}$$

The following will describe that the conditions under which, while the duty ratio in the central region of the IDT electrode is set to about 0.525, and the acoustic velocity ratio V2/V1 becomes about 0.98 or less are 7) and 8) described above.

First, as illustrated in FIG. 8, when the duty ratio in the central region is set to about 0.525, the condition for the acoustic velocity v of the transversal bulk wave of a metal material under which the acoustic velocity ratio is able to be set to about 0.98 or less is $v \leq 2289$ m/s. Note that, when the duty ratio in the central region is smaller than about 0.525, the acoustic velocity V1 in the central region becomes higher than that in the case of the duty ratio about 0.525, so that the acoustic velocity ratio V2/V1 is able to be set to about 0.98 or less similarly, by using the metal satisfying the above conditions for the main electrode layer.

Then, in the metal satisfying the above condition 7), when the duty ratio is about 0.525, the acoustic velocity becomes the maximum value, and thus, in order to make the acoustic velocity ratio V2/V1 the minimum value, V1 is set to a value when the duty ratio is about 0.525, and V2 is set to the minimum value within a range of the duty ratio of about 0.525 or more and about 0.8 or less, for example.

Note that, the value when the duty ratio is about 0.525, and the minimum value in the range of the duty ratio of about 0.525 or more and about 0.8 or less depend on the value of the film thickness of the main electrode layer made of the metal satisfying the condition 7). Thus, in the following, conditions under which the acoustic velocity ratio V2/V1 becomes about 0.98 or less for the material used for the main electrode layer and the film thickness of the main electrode layer will be discussed in detail.

The duty ratio in the central region is set to about 0.525, and the duty ratio in the low acoustic velocity region is set to a duty ratio at which the acoustic velocity becomes the lowest within the range of about 0.525 or more and about 0.80 or less. In this case, when the main electrode layer is made of Pt, as illustrated in FIG. 7, the film thickness of the main electrode layer at which the acoustic velocity ratio V2/V1 of the first low acoustic velocity region and the second low acoustic velocity region, and the central region becomes about 0.98 is about 0.053λ.

Similarly, a relationship similar to that illustrated in FIG. 7 was determined also for the case where the metal satisfying the above 7), such as Au or Ta, for example, was used for the main electrode layer. When the duty ratio in the central region was set to the duty ratio about 0.525, and the duty ratio in the first low acoustic velocity region and the second low acoustic velocity region was set to a duty ratio at which the acoustic velocity becomes the lowest within the range of about 0.525 or more and about 0.80 or less, the film thickness T of the main electrode layer was determined at which the acoustic velocity ratio V2/V1 of the first low acoustic velocity region and the second low acoustic velocity region, and the central region becomes about 0.98. A relationship between this film thickness T and the acoustic velocity v of the transversal bulk wave propagating in the metal that is the main component of the main electrode layer was determined.

Figure 12:
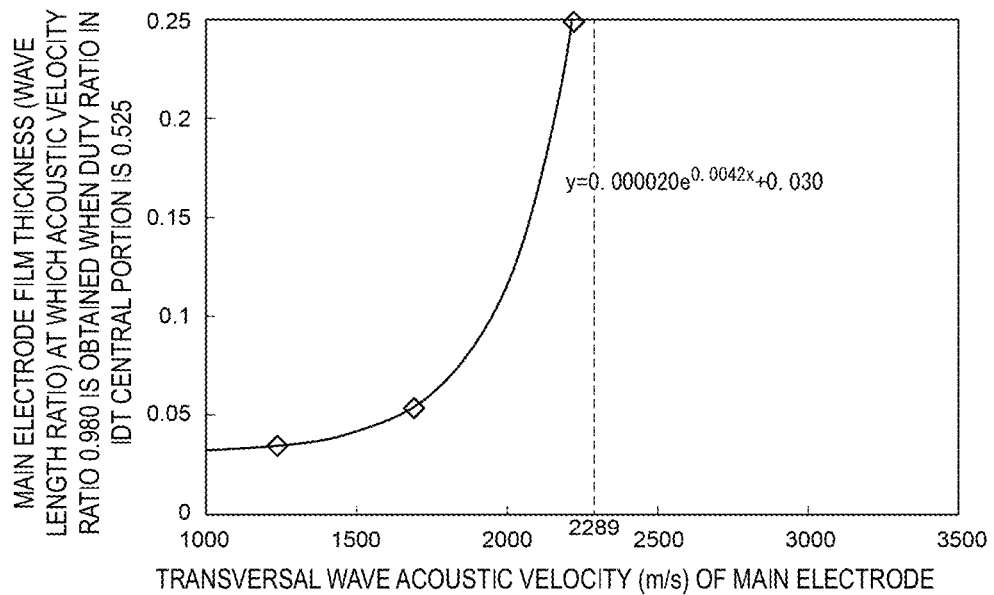
FIG. 12 is a diagram illustrating a relationship between the acoustic velocity v of the transversal bulk wave propagating in the metal that is the main component of the main electrode layer and the film thickness T of the main electrode layer at which the duty ratio in the central region is about 0.525 and the acoustic velocity ratio V2/V1 becomes about 0.98.

FIG. 12 is a diagram illustrating a relationship between the acoustic velocity v of the transversal bulk wave propagating in the metal that is the main component of the main electrode layer, and the film thickness T of the main electrode layer at which the duty ratio in the central region is about 0.525 and the acoustic velocity ratio V2/V1 becomes about 0.98.

Plots indicated in FIG. 12 are approximately located on a curve that is represented by the following formula.

$$T = 0.000020 e^{0.0042v} + 0.030$$

By making the film thickness of the main electrode layer larger than the film thickness T represented by this formula, the acoustic velocity ratio V2/V1 of the first low acoustic velocity region and the second low acoustic velocity region, and the central region is able to be set to about 0.98 or less. Note that, when the duty ratio in the central region is smaller than about 0.525, the acoustic velocity V1 in the central region becomes higher than that in the case of the duty ratio about 0.525, so that by making the film thickness of the main electrode layer larger than the film thickness T expressed by the above formula, similarly the acoustic velocity ratio V2/V1 is able to be set to about 0.98 or less.

Thus, by using the metal satisfying the condition 7) above as the main electrode layer to satisfy a condition of the following Formula 4, the acoustic velocity ratio V2/V1 is able to be set to about 0.98 or less.

$$T \geq 0.000020 e^{0.0042v} + 0.030 \qquad \text{Formula 4}$$

The conditions 7) and 8) are conditions under which the spurious components are able to be effectively reduced or prevented when the duty ratio in the central region is about 0.525. When the duty ratio in the central region is smaller than about 0.525, the acoustic velocity V1 in the central region becomes higher than that in the case of the duty ratio about 0.525, so that by using the metal satisfying the above conditions 7) and 8) for the main electrode layer, the acoustic velocity ratio V2/V1 is able to be set to 0.98 or less, and the spurious components are able to be effectively reduced or prevented. That is, by using the metal satisfying the conditions 7) and 8) for the main electrode layer, as the duty ratio in the central region, a range of about 0.3 or more and about 0.525 or less is able to be selected. That is, since it becomes possible to select a further larger duty ratio, it is possible to further reduce the resistance of the electrode fingers and to further reduce the insertion loss of the acoustic wave device.

Here, it is possible to reduce the electric resistance of the IDT electrode as the duty ratio in the central region of the IDT electrode is increased, and to reduce the insertion loss. For example, when the duty ratio in the central region of the IDT electrode is increased to about 0.55, and when the acoustic velocity ratio V2/V1 becomes about 0.98 or less, the spurious components are able to be effectively reduced or prevented, and the electric resistance of the IDT electrode is able to be further reduced. The inventors of preferred embodiments of the present invention have discovered that the conditions under which, when the duty ratio in the central region of the IDT electrode is set to about 0.55, and the acoustic velocity ratio V2/V1 becomes about 0.98 or less are 9) and 10) described later.

9) $v \leq 2087$ m/s, where v (m/s) is the acoustic velocity of the transversal bulk wave propagating in the metal that is the main component of the main electrode layer.

10) The following Formula 5 is satisfied when $\lambda$ is the wave length defined by the electrode finger pitch of the IDT electrode, and T is the film thickness of the main electrode layer normalized by the wave length $\lambda$.

$$T \geq 0.000017 e^{0.0048v} + 0.033 \qquad \text{Formula 5}$$

The following will describe that the conditions under which, while the duty ratio in the central region of the IDT electrode is set to about 0.55, and the acoustic velocity ratio V2/V1 becomes about 0.98 or less are 9) and 10).

First, as illustrated in FIG. 8, when the duty ratio in the central region is set to about 0.55, the condition for the acoustic velocity v of the transversal bulk wave of a metal material under which the acoustic velocity ratio can be set to about 0.98 or less is $v \leq 2087$ m/s. Note that, when the duty ratio in the central region is smaller than about 0.55, the acoustic velocity V1 in the central region becomes higher than that in the case of the duty ratio of about 0.55, so that the acoustic velocity ratio V2/V1 is able to be set to about 0.98 or less similarly, by using the metal satisfying the above conditions for the main electrode layer.

Then, in the metal satisfying the above condition 9), when the duty ratio is about 0.55, the acoustic velocity becomes the maximum value, and thus, in order to make the acoustic velocity ratio V2/V1 the minimum value, V1 is set to a value when the duty ratio is about 0.55, and V2 is set to the minimum value within a range of the duty ratio of about 0.55 or more and about 0.8 or less, for example.

Note that, the value when the duty ratio is about 0.55, and the minimum value in the range of the duty ratio of about 0.55 or more and about 0.8 or less depend on the value of the film thickness of the main electrode layer made of the metal satisfying the condition 9). Thus, in the following, conditions under which the acoustic velocity ratio V2/V1 becomes about 0.98 or less for the material used for the main electrode layer and the film thickness of the main electrode layer will be discussed in detail.

The duty ratio in the central region is set to about 0.55, and the duty ratio in the low acoustic velocity region is set to a duty ratio at which the acoustic velocity becomes the lowest within a range of about 0.55 or more and about 0.80 or less. In this case, when the main electrode layer is made of Pt, as illustrated in FIG. 7, the film thickness of the main electrode layer at which the acoustic velocity ratio V2/V1 of the first low acoustic velocity region and the second low acoustic velocity region, and the central region becomes about 0.98 is about $0.090\lambda$.

Similarly, a relationship similar to that illustrated in FIG. 7 was determined also for the case where the metal satisfying the above 9), such as Au, for example, was used for the main electrode layer. When the duty ratio in the central region was set to the duty ratio about 0.55, and the duty ratio in the first low acoustic velocity region and the second low acoustic velocity region was set to a duty ratio at which the acoustic velocity becomes the lowest within the range of about 0.55 or more and about 0.80 or less, the film thickness T of the main electrode layer was determined at which the acoustic velocity ratio V2/V1 of the first low acoustic velocity region and the second low acoustic velocity region, and the central region becomes about 0.98. A relationship between this film thickness T and the acoustic velocity v of the transversal bulk wave propagating in the metal that is the main component of the main electrode layer was determined.

Figure 13:
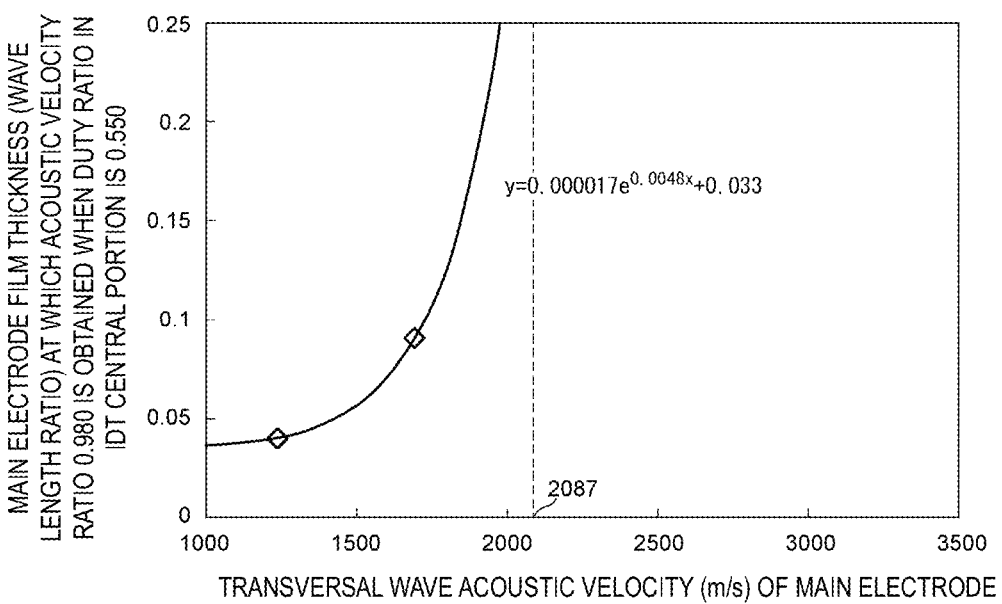
FIG. 13 is a diagram illustrating a relationship between the acoustic velocity v of the transversal bulk wave propagating in the metal that is the main component of the main electrode layer and the film thickness T of the main electrode layer at which the duty ratio in the central region is about 0.55 and the acoustic velocity ratio V2/V1 becomes about 0.98.

FIG. 13 is a diagram illustrating a relationship between the acoustic velocity v of the transversal bulk wave propagating in the metal that is the main component of the main electrode layer, and the film thickness T of the main electrode layer at which the duty ratio in the central region is about 0.55 and the acoustic velocity ratio V2/V1 becomes about 0.98.

Plots indicated in FIG. 13 are approximately located on a curve that is represented by the following formula.

$$T = 0.000017 e^{0.0048v} + 0.033$$

By making the film thickness of the main electrode layer larger than the film thickness T represented by this formula, the acoustic velocity ratio V2/V1 of the first low acoustic velocity region and the second low acoustic velocity region, and the central region is able to be set to about 0.98 or less. Note that, when the duty ratio in the central region is smaller than about 0.55, the acoustic velocity V1 in the central region becomes higher than that in the case of the duty ratio about 0.55, so that by making the film thickness of the main electrode layer larger than the film thickness T expressed by the above formula, the acoustic velocity ratio V2/V1 is able to be set to about 0.98 or less.

Thus, by using the metal satisfying the above 9) as the main electrode layer to satisfy a condition of the following Formula 5, the acoustic velocity ratio V2/V1 is able to be set to about 0.98 or less.

$$T \geq 0.000017 e^{0.0048v} + 0.033 \qquad \text{Formula 5}$$

The conditions 9) and 10) are conditions under which the spurious components are able to be effectively reduced or prevented when the duty ratio in the central region is about 0.55. When the duty ratio in the central region is smaller than about 0.55, the acoustic velocity V1 in the central region becomes higher than that in the case of the duty ratio about 0.55, so that by using the metal satisfying the above conditions 9) and 10) for the main electrode layer, the acoustic velocity ratio V2/V1 is able to be set to about 0.98 or less, and the spurious components are able to be effectively reduced or prevented. That is, by using the metal satisfying conditions 9) and 10) for the main electrode layer, as the duty ratio in the central region, a range of about 0.3 or more and about 0.55 or less is able to be selected. That is, since it becomes possible to select a further larger duty ratio, it is possible to further reduce the resistance of the electrode fingers and to further reduce the insertion loss of the acoustic wave device.

As described above, in the first preferred embodiment, the IDT electrode is a multilayer body including the main electrode layer and the conductive auxiliary electrode layer. Note that, it is sufficient that the IDT electrode includes the main electrode layer, and layered structure is not limited to the above. Examples of layered structure of the IDT electrodes are described below by first to third modification examples of the first preferred embodiment.

Figure 14:
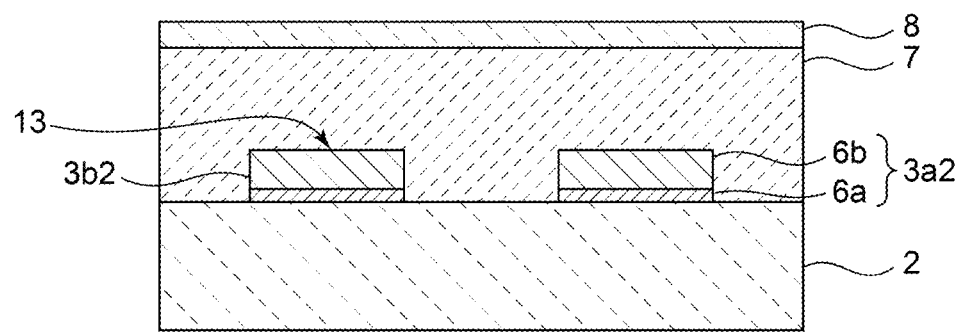
FIG. 14 is an enlarged front sectional view of first electrode fingers and second electrode fingers of an IDT electrode in a first modification example of the first preferred embodiment according to the present invention.

In the first modification example of the first preferred embodiment illustrated in FIG. 14, an adhesion layer 6a is provided on the piezoelectric substrate 2. The main electrode layer 6b is laminated on the adhesion layer 6a. The adhesion layer 6a is preferably made of, for example, Ti or NiCr. Since the adhesion layer 6a is provided, adhesion of an IDT electrode 13 to the piezoelectric substrate 2 is improved.

Figure 15:
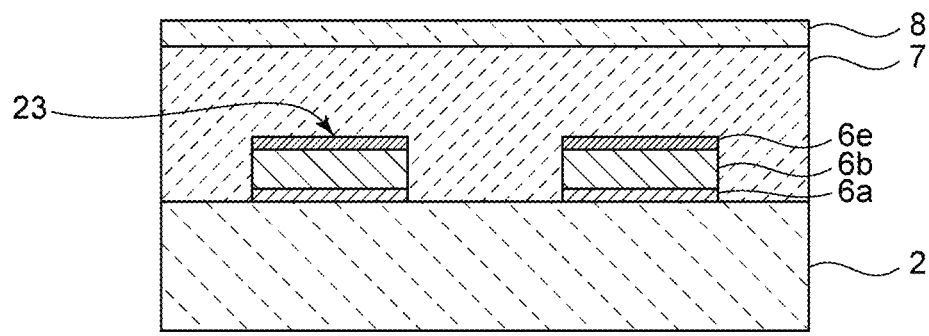
FIG. 15 is an enlarged front sectional view of first electrode fingers and second electrode fingers of an IDT electrode in a second modification example of the first preferred embodiment according to the present invention.

In an IDT electrode 23 in the second modification example of the first preferred embodiment illustrated in FIG. 15, the adhesion layer 6a, the main electrode layer 6b, and an adhesion layer 6e are laminated in this order from a side of the piezoelectric substrate 2.

Figure 16:
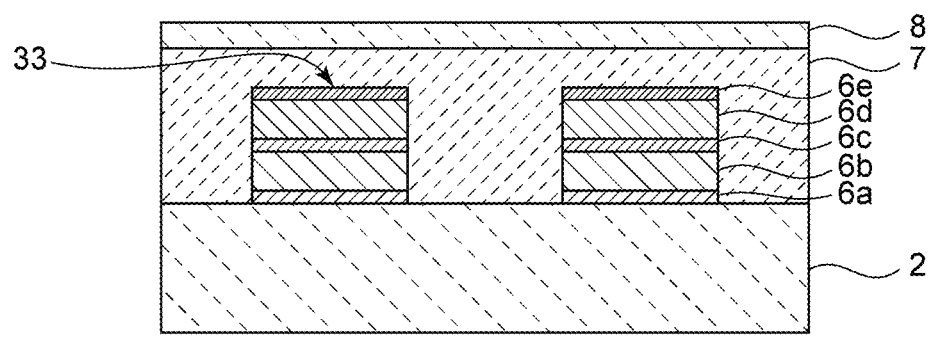
FIG. 16 is an enlarged front sectional view of first electrode fingers and second electrode fingers of an IDT electrode in a third modification example of the first preferred embodiment according to the present invention.

In an IDT electrode 33 in the third modification example of the first preferred embodiment illustrated in FIG. 16, the adhesion layer 6a, the main electrode layer 6b, a diffusion prevention layer 6c, the conductive auxiliary electrode layer 6d, and the adhesion layer 6e are laminated in this order from the side of the piezoelectric substrate 2. The diffusion prevention layer 6c is preferably made of, for example, Ti. By providing the diffusion prevention layer 6c, interdiffusion between the main electrode layer 6b and the conductive auxiliary electrode layer 6d is less likely to occur. Thus, deterioration of the IDT electrode 33 is less likely to occur.

Here, in the first preferred embodiment illustrated in FIG. 1, the first high acoustic velocity region and the second high acoustic velocity region are provided between the first busbar 3a1 and the first edge region A2a and between the second busbar 3b1 and the second edge region A2b, respectively. Note that, the first high acoustic velocity region and the second high acoustic velocity region may be provided in the first busbar 3a1 and in the second busbar 3b1, respectively. This is described in a fourth modification example of the first preferred embodiment described below.

Figure 17:
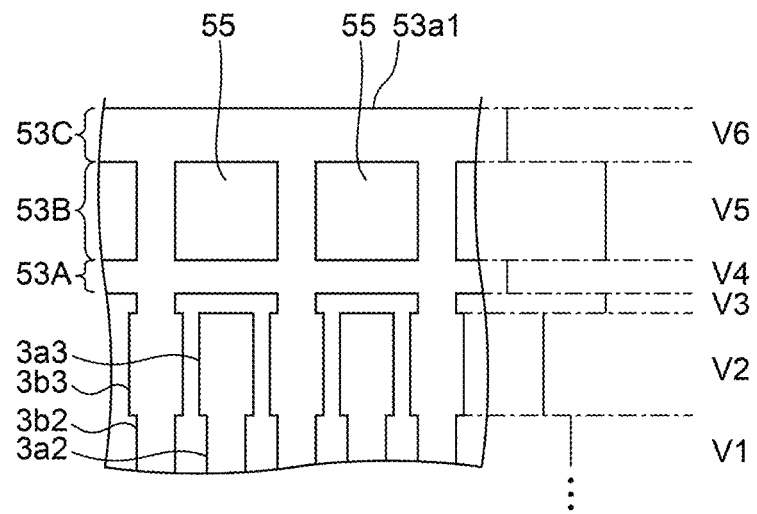
FIG. 17 is an enlarged plan view illustrating a vicinity of a first busbar in a fourth modification example of the first preferred embodiment of the present invention.

FIG. 17 is an enlarged plan view illustrating a vicinity of a first busbar in the fourth modification example of the first preferred embodiment.

In the present modification example, a plurality of cavities 55 is provided in a first busbar 53a1, and the first busbar 53a1 is divided into an inner busbar portion 53A, a central busbar portion 53B, and an outer busbar portion 53C. The inner busbar portion 53A defines and functions as a first low acoustic velocity region together with a first edge region, and the central busbar portion 53B defines and functions as a first high acoustic velocity region. Here, when acoustic velocity in the inner busbar portion 53A is defined as V4, acoustic velocity in the central busbar portion 53B is defined as V5, and acoustic velocity in the outer busbar portion 53C is defined as V6, then V5 is the highest acoustic velocity in the entire region. Since each of the regions where the acoustic velocity becomes V2 to V4 defines and functions as a low acoustic velocity region, and the region where the acoustic velocity becomes V5 defines and functions as a high acoustic velocity region, an acoustic velocity relationship among the regions is represented by V5>V1>(an average of V2 to V4), and a piston mode is established.

The above-described relationship among the respective acoustic velocities V1 to V6 is illustrated in FIG. 17. It is illustrated that in FIG. 17, the acoustic velocity on the outer side is higher. Note that, a side of the second busbar is also configured in the same or substantially the same manner as a side of the first busbar 53a1.

Figure 18:
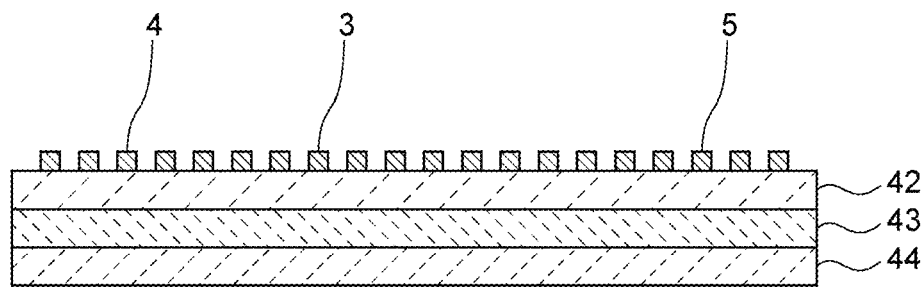
FIG. 18 is a front sectional view of an acoustic wave device according to a fifth modification example of the first preferred embodiment according to the present invention.

In the first preferred embodiment, the piezoelectric body is preferably the piezoelectric substrate 2, for example, but the piezoelectric body may be a piezoelectric thin film 42 as in a fifth modification example of the first preferred embodiment illustrated in FIG. 18. For example, a low acoustic velocity film 43 may be provided on a surface opposite to a surface on which the IDT electrode 3 of the piezoelectric thin film 42 is provided. A high acoustic velocity member 44 may be provided on a surface of the low acoustic velocity film 43 opposite to a side of the piezoelectric thin film 42.

Here, the low acoustic velocity film 43 is a film in which the acoustic velocity of a bulk wave propagating in the piezoelectric thin film 42 is lower than that of an acoustic wave propagating in the piezoelectric thin film 42. The low acoustic velocity film 43 is preferably made of, for example, a material containing, as a main component, a compound obtained by adding fluorine, carbon or boron to glass, silicon oxide, silicon oxynitride, tantalum oxide or silicon oxide, or the like. Note that, as the material of the low acoustic velocity film 43, a material of which acoustic velocity is relatively low is sufficient.

The high acoustic velocity member 44 is a member in which the acoustic velocity of the bulk wave propagating in the piezoelectric thin film 42 is higher than that of the acoustic wave propagating in the piezoelectric thin film 42. The high acoustic velocity member 44 is preferably made of, for example, a material containing aluminum nitride, aluminum oxide, silicon carbide, silicon oxynitride, silicon, a DLC film, or diamond as a main component. Note that, as the material of the high acoustic velocity member 44, a material for which acoustic velocity is relatively high is sufficient.

The high acoustic velocity member 44 may be a high acoustic velocity film or a high acoustic velocity substrate. In this manner, when the low acoustic velocity film 43 and the high acoustic velocity member 44 are provided, energy of an acoustic wave is effectively confined.

In the past, the spurious components other than the spurious components caused by high-order transverse modes reduced or prevented by a piston mode occurred in a vicinity of a pass band in some cases. For example, for an acoustic wave device using a Rayleigh wave, an SH wave becomes the spurious component, and for an acoustic wave device using the SH wave such as a Love wave, the Rayleigh wave becomes the spurious component.

In an acoustic wave device according to a second preferred embodiment of the present invention described below, when the Rayleigh wave is used, in addition to the spurious components caused by high-order transverse modes, the spurious components caused by the SH wave are able to be reduced or prevented.

In the acoustic wave device of the second preferred embodiment, a piezoelectric substrate is preferably made of, for example, LiNbO$_3$, and Euler angles ($\varphi$, $\theta$, $\psi$) of the piezoelectric substrate are defined as described below. Further, a first dielectric film preferably made of silicon oxide is provided. Other than the above points, the acoustic wave device according to the second preferred embodiment has the same or substantially the same structure as that of the acoustic wave device 1 according to the first preferred embodiment illustrated in FIG. 1. Note that, in the second preferred embodiment, the Rayleigh wave is used.

More specifically, in the second preferred embodiment, the Euler angles ($\varphi$, $\theta$, $\psi$) of the piezoelectric substrate are Euler angles (0°±5°, $\theta$, 0°±10°). $\theta$ in the Euler angles ($\varphi$, $\theta$, $\psi$) satisfies $\theta \geq 27°$.

Here, a ratio of density of a material of a main electrode layer to density $\rho_{Pt}$ of Pt is defined as r=$\rho/\rho_{Pt}$. At this time, the Euler angles ($\varphi$, $\theta$, $\psi$) of the piezoelectric substrate 2 are preferably (0°±5°, {−0.054/(T×r−0.044)+31.33}°±1.5°, 0°±10°). This makes it possible to further reduce or prevent the spurious components caused by the SH wave, that matters in the case of using the Rayleigh wave. In addition, in the same or similar manner as in the first preferred embodiment, it is possible to reduce or prevent the spurious components caused by high-order transverse modes. Note that, details of the above relational expression between $\theta$ in the Euler angles ($\varphi$, $\theta$, $\psi$) and the film thickness T of the main electrode layer will be described later.

Advantageous effects in the second preferred embodiment will be described in more detail below.

In the second preferred embodiment, Pt, for example, was preferably used for the main electrode layer, and impedance frequency characteristics and a return loss were measured. Here, a frequency was defined as a normalized frequency with a resonant frequency being 1. Note that, conditions are as follows.

Piezoelectric substrate: material LiNbO$_3$, Euler angles (0°, 30°, 0°)

Main electrode layer: material Pt, film thickness about 0.085λ

Conductive auxiliary electrode layer: material Al, film thickness about 0.08λ

First dielectric film: material SiO$_2$, film thickness about 0.30λ

Second dielectric film: material SiN, film thickness about 0.01λ

Duty ratio in central region: about 0.50

Acoustic wave used: Rayleigh wave

Furthermore, impedance frequency characteristics and a return loss in a comparative example, in which $\theta$ in Euler angles ($\varphi$, $\theta$, $\psi$) of a piezoelectric substrate is out of the range of the second preferred embodiment, were measured. Note that, conditions are as follows. In the comparative example, film structure of an IDT electrode is the same or substantially the same as that in the second preferred embodiment, but the Euler angles of the piezoelectric substrate are set as a condition in an acoustic wave device using the conventional Rayleigh wave.

Piezoelectric substrate: material LiNbO$_3$, Euler angles (0°, 38°, 0°)

Main electrode layer: material Pt, film thickness about 0.085λ

Conductive auxiliary electrode layer: material Al, film thickness about 0.08λ

First dielectric film: material SiO$_2$, film thickness about 0.30λ

Second dielectric film: material SiN, film thickness about 0.01λ

Duty ratio in central region: about 0.50

Acoustic wave used: Rayleigh wave

Figure 19:
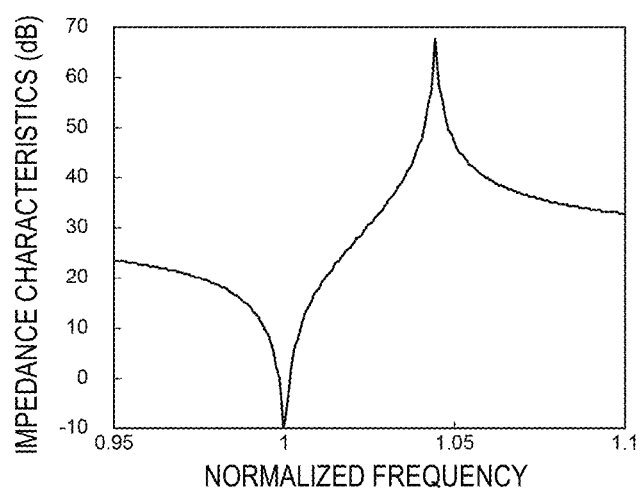
FIG. 19 is a diagram illustrating impedance frequency characteristics of an acoustic wave device according to a second preferred embodiment of the present invention.
Figure 20:
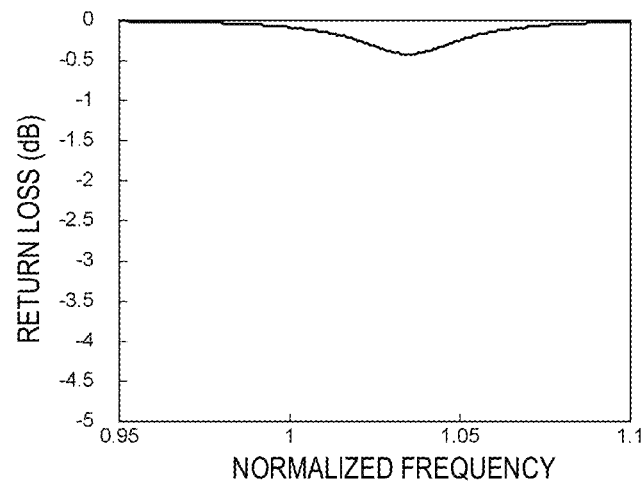
FIG. 20 is a diagram illustrating a return loss of the acoustic wave device according to the second preferred embodiment of the present invention.
Figure 21:
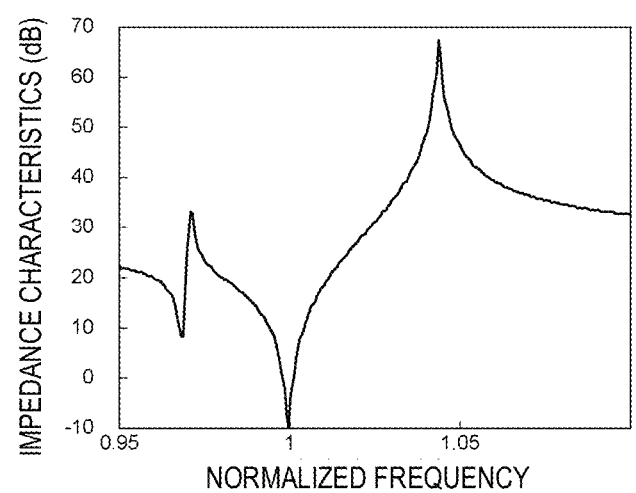
FIG. 21 is a diagram illustrating impedance frequency characteristics of an acoustic wave device of a comparative example.
Figure 22:
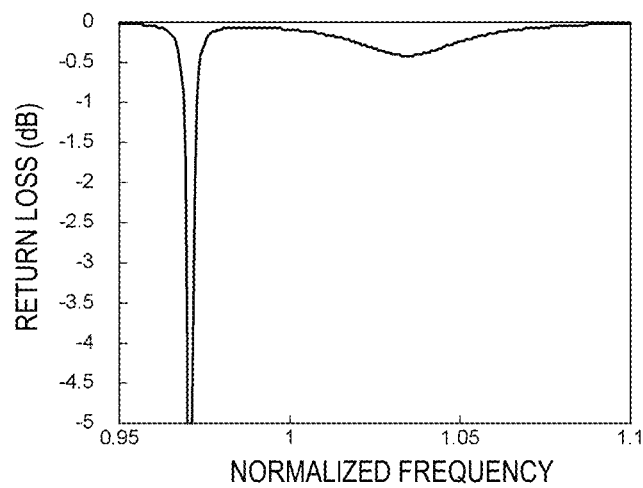
FIG. 22 is a diagram illustrating a return loss of the acoustic wave device of the comparative example.

FIG. 19 is a diagram illustrating the impedance frequency characteristics of the acoustic wave device according to the second preferred embodiment. FIG. 20 is a diagram illustrating the return loss of the acoustic wave device according to the second preferred embodiment. FIG. 21 is a diagram illustrating the impedance frequency characteristics of the acoustic wave device of the comparative example. FIG. 22 is a diagram illustrating the return loss of the acoustic wave device of the comparative example.

As illustrated in FIG. 21 and FIG. 22, it can be seen that a large spurious component is generated on a lower side of the resonant frequency in the comparative example. This spurious component is caused by the SH wave.

On the other hand, as illustrated in FIG. 19 and FIG. 20, in the second preferred embodiment, it can be seen that the spurious component caused by the SH wave is reduced or prevented. An electromechanical coupling coefficient of the SH wave varies depending on a value of $\theta$ in the Euler angles ($\varphi$, $\theta$, $\psi$) of the piezoelectric substrate, the film thickness of the main electrode layer of the IDT electrode, or the like. In the second preferred embodiment, by setting the Euler angles ($\varphi$, $\theta$, $\psi$) within the above range, the electromechanical coupling coefficient of the SH wave is able to be set to 0 or approximately 0. Thus, the spurious component caused by the SH wave is able to be effectively reduced or prevented. Note that, as illustrated in FIG. 19 and FIG. 20, the spurious components caused by high-order transverse modes are not substantially generated.

The above relational expression between $\theta$ in the Euler angles ($\varphi$, $\theta$, $\psi$) and the film thickness T of the main electrode layer was determined as follows. When the value of $\theta$ in the Euler angles ($\varphi$, $\theta$, $\psi$) of the piezoelectric substrate was changed, the film thickness of the main electrode layer at which the electromechanical coupling coefficient of the SH wave became 0 or approximately 0 was determined. The value of $\theta$ and the film thickness of the main electrode layer are shown in Table 2 below. Note that, Pt was used for the main electrode layer.

TABLE 2

| Film thickness (λ) of main electrode layer (Pt) | $\theta$ (°) |
| --- | --- |
| 0.045 | 23 |
| 0.0475 | 25 |
| 0.05 | 26.5 |
| 0.055 | 28 |
| 0.06 | 29 |
| 0.065 | 29.25 |
| 0.07 | 29.75 |
| 0.0775 | 30 |
| 0.0875 | 30.25 |
| 0.0975 | 30.5 |
| 0.1 | 30.5 |

The relationship between $\theta$ in the Euler angles ($\varphi$, $\theta$, $\psi$) of the piezoelectric substrate and the film thickness of the main electrode layer shown in Table 2 is expressed by the following formula. Note that, the film thickness of the main electrode layer when Pt is used for the main electrode layer is defined as $T_{Pt}$.

$$\theta = -0.054/(T_{Pt}-0.044)+31.33$$

Note that, in Table 2, under conditions where the film thickness of the main electrode layer made of Pt is relatively small, and θ in the Euler angles (φ, θ, ψ) is relatively small, the value of θ at which the electromechanical coupling coefficient of the SH wave becomes 0 or approximately 0 greatly changes with respect to the change in the film thickness of the main electrode layer. On the other hand, under conditions where the film thickness of the main electrode layer is relatively large, and the above θ is relatively large, the change in the value of θ at which the electromechanical coupling coefficient of the SH wave becomes 0 or approximately 0 is extremely small with respect to the change in the film thickness of the main electrode layer. That is, under the conditions where the value of the above θ is relatively small, a variation in magnitude of the electromechanical coupling coefficient of the SH wave is large with respect to a variation in the film thickness of the main electrode layer due to variation in manufacturing or the like, and a variation in magnitude of the spurious component caused by the SH wave also becomes large. Thus, it is preferable that θ in the Euler angles (φ, θ, ψ) be in a range of θ≥27°.

When metal other than Pt is used for the main electrode layer, it has been discovered that it is sufficient that the film thickness T of the main electrode layer is set to a film thickness converted by using a ratio $r=\rho/\rho_{Pt}$ of the density ρ of the material of the main electrode layer to the density $\rho_{Pt}$ of Pt. That is, even when metal other than Pt is used for the main electrode layer, the relationship between θ in the Euler angles (φ, θ, ψ) and the film thickness T of the main electrode layer may be expressed by the following formula, when the electromechanical coupling coefficient of the SH wave becomes 0.

$$\theta=-0.054/(T\times r-0.044)+31.33$$

Note that, it is also possible to set the electromechanical coupling coefficient of the SH wave to a value close to 0, even when θ in the Euler angles (φ, θ, ψ) is within a range of {−0.054/(T×r−0.044)+31.33}°±1.5°. Thus, the spurious component caused by the SH wave is able to be effectively reduced or prevented.

Figure 23:
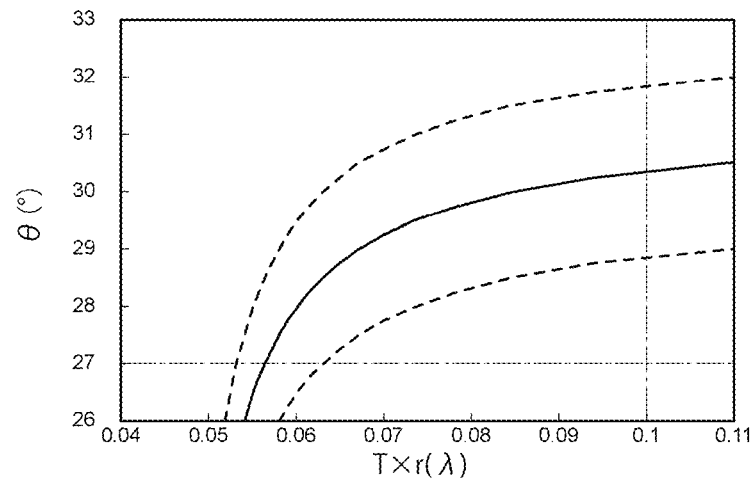
FIG. 23 is a diagram illustrating a range of $\theta$ in Euler angles ($\varphi$, $\theta$, $\psi$) of a piezoelectric substrate in the second preferred embodiment according to the present invention.

FIG. 23 is a diagram illustrating the range of θ in the Euler angles (φ, θ, ψ) of the piezoelectric substrate according to the second preferred embodiment. In FIG. 23, a solid line indicates a relationship of θ=−0.054/(T×r−0.044)+31.33. Dashed lines show relationships of θ={−0.054/(T×r−0.044)+31.33}+1.5 and θ={−0.054/(T×r−0.044)+31.33}−1.5, respectively. Alternate long and short dash lines indicate T×r=0.10λ and θ=27°, respectively.

In the second preferred embodiment, θ in the Euler angles (φ, θ, ψ) is a value within a range surrounded by a broken line and the alternate long and short dash lines in FIG. 23. As described above, since θ is within the range of {−0.054/(T×r−0.044)+31.33}°±1.5°, it is possible to effectively reduce or prevent the spurious component caused by the SH wave. In the second preferred embodiment, since θ≥27° is satisfied, the spurious component caused by the SH wave is able to be stably reduced or prevented. In addition, since T×r≤0.10λ is satisfied, the IDT electrode is able to be suitably formed at the time of manufacturing, and a crack is less likely to occur in a dielectric film.

As described above, preferred embodiments of the present invention clarify that, it is possible to effectively reduce or prevent the spurious components when the acoustic velocity ratio V2/V1 is set to about 0.98 or less.

In Japanese Unexamined Patent Application Publication No. 2013-518455, there is no description regarding the acoustic velocity ratio V2/V1. In addition, in the structure in Japanese Unexamined Patent Application Publication No. 2013-518455, although there is a case where the spurious components occur depending on the acoustic velocity ratio V2/V1, preferred embodiments of the present invention are able to effectively reduce or prevent the spurious components by setting the acoustic velocity ratio V2/V1 to about 0.98 or less.

Further, the above conditions are achieved both in the configuration illustrated in FIG. 1 and the configuration illustrated in FIG. 17.

Further, the above conditions are achieved not only by the method in which the first and second low acoustic velocity regions are provided by making the duty ratio in the first and second edge regions larger than the duty ratio in the central region, but also by the method in which the mass addition film made of the dielectric or the metal is layered on the first and second electrode fingers to provide the low acoustic velocity region.

In the first and second preferred embodiments and the first to fourth modification examples of the first preferred embodiment, the examples in which the acoustic wave device is the one-port acoustic wave resonator are illustrated. Note that, the present invention may also be suitably applied to an acoustic wave device other than the above.

The above-described acoustic wave devices are able to be used as a duplexer or the like of a high-frequency front end circuit. An example thereof will be described below.

Figure 24:
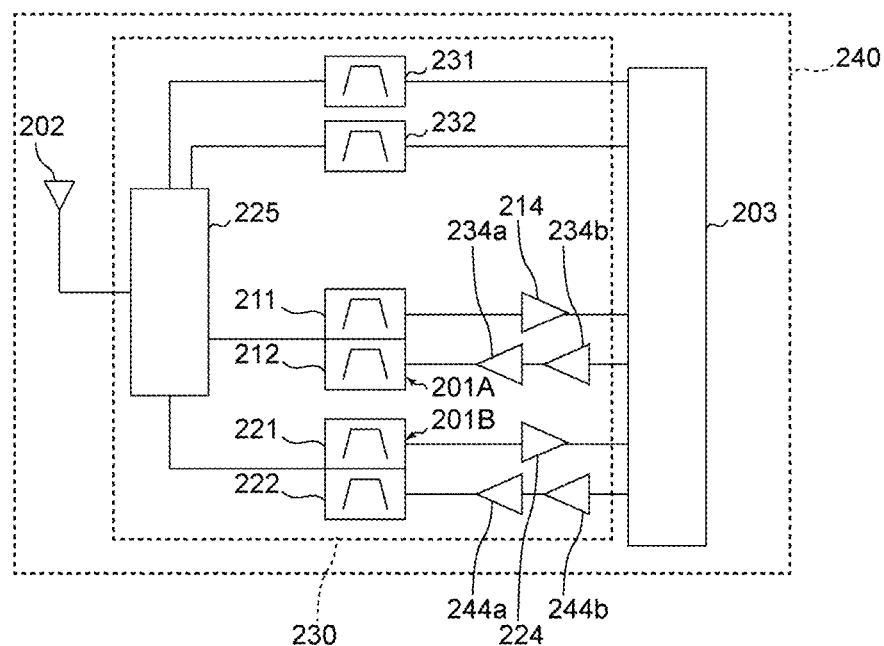
FIG. 24 is a block diagram of a communication device including a high-frequency front end circuit according to a preferred embodiment of the present invention.

FIG. 24 is a block diagram of a communication device having a high-frequency front end circuit according to a preferred embodiment of the present invention. In addition, in the figure, respective components connected to a high-frequency front end circuit 230, for example, an antenna element 202 and an RF signal processing circuit (RFIC) 203 are also illustrated. The high-frequency front end circuit 230 and the RF signal processing circuit 203 define a communication device 240. Note that, the communication device 240 may include, for example, a power supply, a CPU, a display, and the like.

The high-frequency front end circuit 230 includes a switch 225, duplexers 201A, 201B, filters 231, 232, low-noise amplifier circuits 214, 224, and power amplifier circuits 234a, 234b, 244a, and 244b. Note that, the high-frequency front end circuit 230 and the communication device 240 illustrated in FIG. 24 are examples of a high-frequency front end circuit and a communication device, and are not limited to this configuration.

The duplexer 201A includes filters 211 and 212. The duplexer 201B includes filters 221 and 222. The duplexers 201A and 201B are connected with the antenna element 202 with the switch 225 interposed therebetween. Note that, acoustic wave devices according to preferred embodiments of the present invention may be used for the duplexers 201A, 201B, or may be used for the filters 211, 212, 221, 222. The acoustic wave devices according to preferred embodiments of the present invention may be acoustic wave resonators that define the duplexers 201A, 201B, or the filters 211, 212, 221, 222.

Further, the acoustic wave devices according to preferred embodiments of the present invention may be applied to a multiplexer including three or more filters such as, for example, a triplexer including three antenna terminals common to each other, and a hexaplexer including six filter antenna terminals common to each other.

That is, the acoustic wave devices according to preferred embodiments of the present invention include the acoustic wave resonators, the filters, the duplexers, and the multiplexers including the three or more filters. In addition, the multiplexer is not limited to a configuration including both a transmission filter and a reception filter, and may be configured to include only a transmission filter or a reception filter.

The switch 225 connects the antenna element 202 to a signal path corresponding to a predetermined band in accordance with a control signal from a control unit (not shown), and is defined by, for example, a Single Pole Double Throw (SPDT) switch. Note that, the number of signal paths connected to the antenna element 202 is not limited to one, and may be a plurality of signal paths. That is, the high-frequency front end circuit 230 may support carrier aggregation.

The low-noise amplifier circuit 214 is a reception amplifier circuit that amplifies a high-frequency signal (here, a high-frequency reception signal) passing through the antenna element 202, the switch 225, and the duplexer 201A, and outputs to the RF signal processing circuit 203. The low-noise amplifier circuit 224 is a reception amplifier circuit that amplifies a high-frequency signal (here, a high-frequency reception signal) passing through the antenna element 202, the switch 225, and the duplexer 201B, and outputs to the RF signal processing circuit 203.

Each of the power amplifier circuits 234a and 234b is a transmission amplifier circuit that amplifies a high-frequency signal (here, a high-frequency transmission signal) outputted from the RF signal processing circuit 203, and outputs to the antenna elements 202 via the duplexer 201A and the switch 225. Each of the power amplifier circuits 244a and 244b is a transmission amplifier circuit that amplifies a high-frequency signal (here, a high-frequency transmission signal) outputted from the RF signal processing circuit 203, and outputs to the antenna elements 202 via the duplexer 201B and the switch 225.

The RF signal processing circuit 203 applies signal processing to a high-frequency reception signal inputted from the antenna element 202 via a reception signal path by down-conversion or the like, and outputs a reception signal generated by the signal processing. Further, the RF signal processing circuit 203 applies signal processing to an inputted transmission signal by up-converting or the like, and outputs a high-frequency transmission signal generated by the signal processing to the power amplifier circuits 234b or 244b. The RF signal processing circuit 203 is preferably, for example, an RFIC. Note that, the communication device may include a Base Band (BB) IC. In this case, the BBIC applies signal processing to a reception signal processed by the RFIC. Further, the BBIC applies signal processing to a transmission signal and outputs to the RFIC. The reception signal processed by the BBIC or a transmission signal before subjected to the signal processing by the BBIC is preferably, for example, an image signal, a sound signal, or the like. Note that, the high-frequency front end circuit 230 may include other circuit elements between the respective components described above.

Note that, the high-frequency front end circuit 230 may include duplexers according to the modification examples of the duplexers 201A and 201B in place of the duplexers 201A and 201B.

On the other hand, the filters 231 and 232 in the communication device 240 are connected between the RF signal processing circuit 203 and the switch 225 without the low-noise amplifier circuits 214, 224 and the power amplifier circuits 234a, 234b, 244a, and 244b interposed therebetween. The filters 231 and 232 are also connected with the antenna element 202 with the switch 225 interposed therebetween, similarly to the duplexers 201A and 201B.

According to the high-frequency front end circuit 230 and the communication device 240 configured as described above, by including the acoustic wave resonator, the filter, the duplexer, the multiplexer including three or more number of the filters, and the like, that are defined by acoustic wave devices according to preferred embodiments of the present invention, it is possible to effectively reduce or prevent the spurious components caused by high-order transverse modes.

Although the acoustic wave devices, the high-frequency front end circuits, and the communication devices according to the preferred embodiments of the present invention have been described with reference to the preferred embodiments and the modification examples thereof, another preferred embodiment provided by combining arbitrary elements in the above-described preferred embodiments and modification examples thereof, modification examples obtained by applying various modifications that those skilled in the art think about to the above-described preferred embodiments within the scope of the present invention, and various devices incorporating the high-frequency front end circuits and the communication devices according to preferred embodiments of the present invention are also included in the present invention.

Preferred embodiments of the present invention are widely applicable to a communication apparatus, such as a cellular phone, for example, as a multiplexer, a front end circuit, a communication device, that may be applied to an acoustic wave resonator, a filter, a duplexer, and a multiband system.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
    a piezoelectric body; and
    an IDT electrode provided on the piezoelectric body and including a main electrode layer; wherein
    the IDT electrode includes a first busbar and a second busbar facing each other, a plurality of first electrode fingers first ends of which are connected with the first busbar, and a plurality of second electrode fingers first ends of which are connected with the second busbar, the plurality of second electrode fingers being interdigitated with the plurality of first electrode fingers;
    the IDT electrode further includes an intersecting region in which the plurality of first electrode fingers and the plurality of second electrode fingers overlap each other in an acoustic wave propagation direction;
    when a direction in which the plurality of first electrode fingers extend or a direction in which the plurality of second electrode fingers extend is defined as a length direction, the intersecting region includes a central region located at a central portion of the first electrode fingers and the second electrode fingers in the length direction, a first low acoustic wave region which is disposed on an outside of the central region on a side of the first busbar in the length direction and in which an acoustic velocity is lower than an acoustic velocity in the central region, and a second low acoustic velocity region which is disposed on an outside of the central region on a side of the second busbar in the length direction and in which an acoustic velocity is lower than the acoustic velocity in the central region;
a first high acoustic velocity region which is disposed on an outside of the first low acoustic velocity region on the side of the first busbar in the length direction and in which an acoustic velocity is higher than the acoustic velocity in the central region, and a second high acoustic velocity region which is disposed on an outside of the second low acoustic velocity region on the side of the second bulbar in the length direction and in which an acoustic velocity is higher than the acoustic velocity in the central region are provided;
a duty ratio in the first low acoustic velocity region and the second low acoustic velocity region is greater than a duty ratio in the central region;
$v \leq 3299$ m/s is satisfied, where v (m/s) represents an acoustic velocity of a transversal bulk wave propagating in metal that is a main component of the main electrode layer;
when $\lambda$ represents a wave length that corresponds to an electrode finger pitch of the IDT electrode and T represents a film thickness of the main electrode layer normalized by the wave length $\lambda$, $T \geq 0.00018 e^{0.002v} + 0.014$ is satisfied; and
$V2/V1 \leq 0.98$ is satisfied, where V1 represents the acoustic velocity in the central region and V2 represents the acoustic velocity in the first low acoustic velocity region and the second low acoustic velocity region.

2. A high-frequency front end circuit comprising:
the acoustic wave device according to claim 1; and
a power amplifier.

3. The high-frequency front end circuit according to claim 2, wherein the IDT electrode includes a plurality of layers including the main electrode layer.

4. A communication device, comprising:
the high-frequency front end circuit according to claim 2; and
an RF signal processing circuit.

5. The acoustic wave device according to claim 1, wherein the IDT electrode includes a plurality of layers including the main electrode layer.

6. The acoustic wave device according to claim 1, wherein the main electrode layer includes any one of Au, Pt, Ta, Cu, Ni, and Mo as a main component.

7. The acoustic wave device according to claim 1, wherein in the IDT electrode, $v \leq 2895$ m/s is satisfied, and $T \geq 0.000029 e^{0.0032v} + 0.02$ is satisfied.

8. The acoustic wave device according to claim 1, wherein in the IDT electrode, $v \leq 2491$ m/s is satisfied, and $T \geq 0.000038 e^{0.0035v} + 0.025$ is satisfied.

9. The acoustic wave device according to claim 1, wherein in the IDT electrode, $v \leq 2289$ m/s is satisfied, and $T \geq 0.000020 e^{0.0042v} + 0.03$ is satisfied.

10. The acoustic wave device according to claim 1, wherein in the IDT electrode, $v \leq 2087$ m/s is satisfied, and $T \geq 0.000017 e^{0.0048v} + 0.033$ is satisfied.

11. The acoustic wave device according to claim 1, wherein
the piezoelectric body is made of LiNbO$_3$, Euler angles ($\varphi$, $\theta$, $\psi$) of the piezoelectric body are Euler angles (0°±5°, $\theta$, 0°±10°), $\theta$ in the Euler angles ($\varphi$, $\theta$, $\psi$) of the piezoelectric body satisfies $\theta \geq 27°$; and
the Euler angles ($\varphi$, $\theta$, $\psi$) are (0°±5°, {−0.054/(T×r−0.044)+31.33}°±1.5°, 0°±10°), and T×r≤0.10λ is satisfied, where a ratio of density ρ of a material of the main electrode layer to density $\rho_{Pt}$ of Pt is defined as r=ρ/$\rho_{Pt}$.

12. The acoustic wave device according to claim 1, wherein
the first busbar and the second busbar of the IDT electrode include cavities;
in the first and second busbars, a portion located closer to the central region in the length direction than the cavity is an inner busbar portion, a portion opposite to the inner busbar portion with the cavity interposed is an outer busbar portion;
in the first busbar, the inner busbar portion is a low acoustic velocity region, a region in which the cavity is provided is the first high acoustic velocity region; and
in the second busbar, the inner busbar portion is a low acoustic velocity region, and a region in which the cavity is provided is the second high acoustic velocity region.

13. The acoustic wave device according to claim 1, further comprising a dielectric film provided on the piezoelectric body and covering the IDT electrode.

14. An acoustic wave device, comprising:
a piezoelectric body; and
an IDT electrode provided on the piezoelectric body and including a main electrode layer; wherein
the IDT electrode includes a first busbar and a second busbar facing each other, a plurality of first electrode fingers first ends of which are connected with the first busbar, and a plurality of second electrode fingers first ends of which are connected with the second busbar, the plurality of second electrode fingers are interdigitated with the plurality of first electrode fingers;
the IDT electrode further includes an intersecting region in which the plurality of first electrode fingers and the plurality of second electrode fingers overlap each other in an acoustic wave propagation direction;
when a direction in which the plurality of first electrode fingers extends or a direction in which the plurality of second electrode fingers extends is defined as a length direction, the intersecting region includes, a central region located at a central portion in the first electrode fingers and the second electrode fingers in the length direction, a first low acoustic wave region which is disposed on an outside of the central region on a side of the first busbar in the length direction and in which an acoustic velocity is lower than an acoustic velocity in the central region, and a second low acoustic velocity region which is disposed on an outside of the central region on a side of the second busbar in the length direction and in which an acoustic velocity is lower than the acoustic velocity in the central region;
a first high acoustic velocity region which is disposed on an outside of the first low acoustic velocity region on a side of the first busbar in the length direction and in which an acoustic velocity is higher than the acoustic velocity in the central region, and a second high acoustic velocity region which is disposed on an outside of the second low acoustic velocity region on a side of the second busbar in the length direction and in which an acoustic velocity is higher than the acoustic velocity in the central region are provided;
a duty ratio in the first low acoustic velocity region and the second low acoustic velocity region is greater than a duty ratio in the central region;
$v \leq 3299$ m/s is satisfied, where v (m/s) represents an acoustic velocity of a transversal bulk wave propagating in metal that is a main component of the main electrode layer;

when T represents a film thickness of the main electrode layer normalized by a wave length that corresponds to an electrode finger pitch of the IDT electrode, $T \geq 0.00018 e^{0.002v} + 0.014$ is satisfied; and an acoustic velocity ratio V3/V1 is about 1.08, where V3 represents the acoustic velocity of the first high acoustic velocity region and the acoustic velocity of the second high acoustic velocity region, and V1 represents the acoustic velocity of the central region.

15. A high-frequency front end circuit comprising:
the acoustic wave device according to claim 14; and
a power amplifier.

16. The high-frequency front end circuit according to claim 15, wherein the IDT electrode includes a plurality of layers including the main electrode layer.

17. A communication device, comprising:
the high-frequency front end circuit according to claim 15; and
an RF signal processing circuit.

18. The acoustic wave device according to claim 14, further comprising a dielectric film provided on the piezoelectric body and covering the IDT electrode.

19. The acoustic wave device according to claim 14, wherein the IDT electrode includes a plurality of layers including the main electrode layer.

20. The acoustic wave device according to claim 14, wherein the main electrode layer includes any one of Au, Pt, Ta, Cu, Ni, and Mo as a main component.

* * * * *